(12) United States Patent
Lin

(10) Patent No.: US 11,664,799 B2
(45) Date of Patent: May 30, 2023

(54) ANALOG SWITCH CIRCUIT AND CONTROL CIRCUIT AND CONTROL METHOD THEREOF

(71) Applicant: Richtek Technology Corporation, Zhubei (TW)

(72) Inventor: Yu-Po Lin, Miaoli (TW)

(73) Assignee: RICHTEK TECHNOLOGY CORPORATION, Zhubei (TW)

(*) Notice: Subject to any disclaimer, the term of this patent is extended or adjusted under 35 U.S.C. 154(b) by 0 days.

(21) Appl. No.: 17/685,237

(22) Filed: Mar. 2, 2022

(65) Prior Publication Data

US 2022/0302915 A1    Sep. 22, 2022

Related U.S. Application Data

(60) Provisional application No. 63/163,019, filed on Mar. 18, 2021.

(30) Foreign Application Priority Data

Nov. 11, 2021   (TW) .................................. 110142062

(51) Int. Cl.
*H03K 5/08* (2006.01)
*H03K 17/082* (2006.01)
*H03K 17/56* (2006.01)
*H03K 17/687* (2006.01)
*G01R 19/10* (2006.01)
*H03F 3/04* (2006.01)

(52) U.S. Cl.
CPC .......... *H03K 17/687* (2013.01); *G01R 19/10* (2013.01); *H03F 3/04* (2013.01)

(58) Field of Classification Search
None
See application file for complete search history.

(56) References Cited

U.S. PATENT DOCUMENTS

| | | | | |
|---|---|---|---|---|
| 3,723,763 A * | 3/1973 | Udovic | ............ | G01R 19/16519 327/348 |
| 4,731,574 A * | 3/1988 | Melbert | .................. | G05F 1/573 323/275 |
| 5,736,890 A * | 4/1998 | Yee | ........................ | H02M 7/217 327/423 |
| 5,796,289 A * | 8/1998 | Rees | .................. | H03K 17/0822 327/425 |
| 6,185,082 B1 * | 2/2001 | Yang | ....................... | H02M 1/32 361/93.7 |

(Continued)

*Primary Examiner* — Kenneth B Wells
(74) *Attorney, Agent, or Firm* — Tung & Associates

(57) ABSTRACT

An analog switch circuit includes: a switch unit and a control circuit, wherein the control circuit includes a sensor circuit and a gate-source voltage adjustment circuit. The switch unit operates a first switch therein according to a first gate-source voltage, to convert an input signal of an input terminal to an output signal of an output terminal. The sensor circuit is coupled between the input terminal and the output terminal, and generates a sensing signal according to a voltage difference between the input signal and the output signal. The gate-source voltage adjustment circuit is coupled to the sensor circuit, and adaptively adjusts the first gate-source voltage according to the sensing signal, to maintain the conduction resistance of the switch unit at a constant while the voltage difference changes.

31 Claims, 13 Drawing Sheets

(56) References Cited

U.S. PATENT DOCUMENTS

| | | | | |
|---|---|---|---|---|
| 6,353,309 B1* | 3/2002 | Ootani | ............... | H03K 17/122 |
| | | | | 323/282 |
| 6,366,068 B1* | 4/2002 | Morishita | ............. | H02M 3/156 |
| | | | | 323/284 |
| 7,176,665 B2* | 2/2007 | Knoedgen | ........ | G01R 19/16538 |
| | | | | 323/282 |
| 7,362,157 B2* | 4/2008 | Logiudice | ............... | G05F 1/575 |
| | | | | 327/318 |
| 8,232,830 B2* | 7/2012 | Takeshita | ............. | H03K 17/302 |
| | | | | 327/330 |
| 8,502,595 B2* | 8/2013 | Stultz | .................. | H03K 17/145 |
| | | | | 327/434 |
| 10,312,898 B2* | 6/2019 | Moctezuma | ....... | H03K 17/0822 |
| 2003/0016072 A1 | 1/2003 | Ramakrishnan | | |

\* cited by examiner

ANALOG SWITCH CIRCUIT AND CONTROL CIRCUIT AND CONTROL METHOD THEREOF

CROSS REFERENCE

The present invention claims priority to U.S. 63/163,019 filed on Mar. 18, 2021 and claims priority to TW 110142062 filed on Nov. 11, 2021.

BACKGROUND OF THE INVENTION

Field of Invention

The present invention relates to an analog switch circuit; particularly, it relates to such analog switch circuit capable of improving harmonic distortion. The present invention also relates to a control circuit and a control method of such analog switch circuit.

Description of Related Art

Please refer to FIG. 1, which shows a schematic diagram of a conventional analog switch circuit 10. The analog switch circuit 10 comprises: a first switch Q1 and a second switch Q2, which are connected in series between an input signal Vin and the output signal Vout. The first switch Q1 and the second switch Q2 have a channel resistance R0, and when the first switch Q1 and the second switch Q2 operate to convert the input signal Vin to the output signal Vout, there is a channel resistance variation $\Delta R$, wherein the channel resistance variation $\Delta R$ is correlated with a variation of the input signal Vin, a variation of the output signal Vout and a variation of ambient temperature. Besides, the analog switch circuit 10 has a parasitic resistance Rp. The output signal Vout is applied to a load resistance RL which is electrically connected to a ground level. Under such situation, the output signal Vout can be represented by the following equation:

$$V_{OUT} = \frac{V_{IN}}{\frac{\Delta R}{R_L}V_{IN} + \frac{R_0 + R_{Parasitic}}{R_L} + 1}$$

Through Fourier transformation of the above equation, the following equation can be obtained:

$$f[V_{in}] = \frac{V_{in}}{B} - \frac{A}{B^2}V_{in}^2 + \frac{A^2}{B^3}V_{in}^3 - \frac{A^3}{B^4}V_{in}^4 + \frac{A^4}{B^5}V_{in}^5$$

wherein $A = \frac{\Delta R}{R_L}$, $B = \frac{R_0 + R_{Parasitic}}{R_L} + 1$

In a case when the input signal Vin is a sinusoidal wave, which can be represented as: $V_{in}=\sin(2\pi ft)$, the following equations can be obtained:

$$\text{fundamental} = \left(\frac{1}{B} + \frac{3A^2}{4B^3} + \frac{5A^4}{8B^5}\right)\sin(2\pi ft)$$

$$\text{2nd harmonic} = \left(\frac{A}{2B^2} + \frac{A^3}{2B^4}\right)\sin\left(4\pi f + \frac{\pi}{2}\right)$$

-continued $$\text{3nd harmonic} = \left(\frac{A^2}{4B^3} + \frac{5A^4}{16B^5}\right)\sin(6\pi f + \pi)$$

$$\text{4nd harmonic} = \left(\frac{A^3}{8B^4}\right)\sin\left(8\pi f + \frac{3\pi}{2}\right)$$

$$\text{5nd harmonic} = \left(\frac{A^4}{16B^5}\right)\sin(10\pi f)$$

In light of above, when $\Delta R/R_L$ is smaller, a distortion of the resonant waveform will be better alleviated, and if the load resistance RL is small, the harmonic distortion will become more serious. Therefore, in light load condition (i.e., in a case when the load resistance RL is low), it is a challenge to reduce the harmonic distortion.

Please refer to FIG. 2A and FIG. 2B. FIG. 2A shows a schematic diagram of a conventional analog switch circuit 20 constituted by PMOS/NMOS devices. FIG. 2B illustrates the harmonic distortion of the output signal Vout of the conventional analog switch circuit 20 of FIG. 2A. In the analog switch circuit 20, because the PMOS device and the NMOS device both receive a constant gate voltage Vg, a gate-source voltage of the PMOS device and a gate-source voltage of the NMOS device will change as the input signal Vin changes. A channel resistance of the analog switch circuit 20 will change accordingly due to the characteristics of the PMOS and NMOS devices. However, the variation of the channel resistance will cause the harmonic distortion of the output signal Vout to become more serious. The distortion of the resonant waveform of the analog switch circuit 20 is shown in FIG. 2B. FIG. 2B illustrates that the analog switch circuit 20 constituted by PMOS and NMOS devices shown in FIG. 2A can only provide a performance of approximately −90 dB.

Please refer to FIG. 3A, FIG. 3B and FIG. 3C. FIG. 3A shows a schematic diagram of a conventional analog switch circuit 30. FIG. 3B shows a simulation schematic diagram of electrical characteristics of the conventional analog switch circuit 30 of FIG. 3A. FIG. 3C illustrates the harmonic distortion of the output signal Vout of the conventional analog switch circuit 30 of FIG. 3A. As shown in FIG. 3A, by providing a constant voltage Vgs as a gate-source voltage of each MOS device of the analog switch circuit 30, the gate-source voltage of each MOS device will not change as an input signal Vin changes. However as shown in FIG. 3B, although the gate-source voltage is a constant voltage Vgs, as the input signal Vin changes, the channel voltage VRon, the channel resistance Ron and the load current ILoad change greatly, which will accordingly affect the performance of the harmonic distortion. As shown in FIG. 3C, as compared to the analog switch circuit 20 and the analog switch circuit 10, although the analog switch circuit can provide a better performance of harmonic distortion (approximately −110 dB), such configuration is still not satisfactory.

Note that, as well known by one skilled in this art, a gate-source voltage refers to a voltage difference between a gate and a source; a drain-source voltage refers to a voltage difference between a drain and a source; a drain-source current refers to a current flowing between a drain and a source.

As compared to the above-mentioned prior arts, the present invention provides an analog switch circuit, and a control circuit and a control method of such analog switch circuit, which are capable of adaptively adjusting a gate-source voltage via feedback mechanism according to a channel voltage variation, so as to maintain a channel resistance at a constant while the channel voltage changes.

SUMMARY OF THE INVENTION

From one perspective, the present invention provides an analog switch circuit, comprising: a switch unit including a first switch, wherein the first switch is coupled to a current path formed between an input terminal and an output terminal, and wherein the first switch is configured to operably convert an input signal of the input terminal to an output signal of the output terminal according to a first gate-source voltage of the first switch; and a control circuit including: a sensor circuit coupled between the input terminal and the output terminal, wherein the sensor circuit is configured to operably generate a sensing signal according to a voltage difference between the input signal and the output signal; and a gate-source voltage adjustment circuit coupled to the sensor circuit, wherein the gate-source voltage adjustment circuit is configured to operably generate and adaptively adjust the first gate-source voltage according to the sensing signal, so as to maintain a conduction resistance of the switch unit at a constant while the voltage difference changes.

From another perspective, the present invention provides a control circuit of an analog switch circuit, comprising: a sensor circuit coupled between an input terminal and an output terminal, wherein the sensor circuit is configured to operably generate a sensing signal according to a voltage difference between an input signal of the input terminal and an output signal of the output terminal; and a gate-source voltage adjustment circuit coupled to the sensor circuit, wherein the gate-source voltage adjustment circuit is configured to operably generate and adaptively adjust a first gate-source voltage according to the sensing signal, so as to operate a first switch of a first switch in a switch unit of the analog switch circuit, thereby converting the input signal to the output signal and thereby maintaining a conduction resistance of the switch unit at a constant while the voltage difference changes; wherein the first switch is coupled in a current path formed between the input terminal and the output terminal.

From yet another perspective, the present invention provides a control method of an analog switch circuit, comprising the following steps: operating a first switch in the analog switch circuit according to a first gate-source voltage of the first switch, so as to convert an input signal of the input terminal to an output signal of the output terminal; generating a sensing signal according to a voltage difference between the input signal and the output signal; and adaptively adjusting the first gate-source voltage according to the sensing signal, so as to maintain a conduction resistance of the analog switch circuit at a constant while the voltage difference changes; wherein the first switch is coupled in a current path formed between the input terminal and the output terminal.

In one embodiment, the control circuit further includes: a voltage-divider circuit coupled between the input terminal and the output terminal, wherein voltage divider circuit is configured to operably provide a bulk-source divided voltage into the voltage difference, so that the gate-source voltage adjustment circuit adaptively adjusts the first gate-source voltage further according to the bulk-source divided voltage.

In one embodiment, the switch unit further includes a second switch, wherein the first switch and the second switch are coupled in series between the input terminal and the output terminal.

In one embodiment, a relationship between the first gate-source voltage and the voltage difference is represented by a following equation: Vgs1=Vc1+K×Vdif, wherein the first gate-source voltage Vgs1 is equal to a sum of a constant voltage Vc1 plus a product of the voltage difference Vdif multiplied by a coefficient K; wherein the coefficient K is a real number greater than one.

In one embodiment, the gate-source voltage adjustment circuit is further configured to operably generate a second gate-source voltage of the second switch according to the sensing signal, so as to control the second switch, to thereby maintain the conduction resistance of the switch unit at the constant while the voltage difference changes.

In one embodiment, the second gate-source voltage is a constant.

In one embodiment, the control circuit further includes: a voltage divider circuit coupled between the input terminal and the output terminal, wherein voltage divider circuit is configured to operably provide a bulk-source divided voltage into the voltage difference, so that the gate-source voltage adjustment circuit adaptively adjusts the first gate-source voltage further according to the a bulk-source divided voltage.

In one embodiment, the sensor circuit includes: an amplifier circuit having a first amplifier input terminal and a second amplifier input terminal; a first resistor coupled between the first amplifier input terminal and the input terminal; and a second resistor coupled between the second amplifier input terminal and the output terminal; wherein the amplifier circuit regulates a voltage at the first amplifier input terminal and a voltage at the amplifier second input terminal to be a same level by a negative feedback control mechanism; wherein the amplifier circuit generates an amplification current, and wherein the sensing signal is proportional to the amplification current.

In one embodiment, the sensor circuit further includes: a current mirror circuit, which is configured to operably duplicate and amplify the amplification current, so as to generate the sensing signal.

In one embodiment, the amplifier circuit includes: a first super source follower.

In one embodiment, the gate-source voltage adjustment circuit includes: a first impedance circuit coupled between a first gate of the first switch and a first source of the first switch, wherein the first impedance circuit is configured to operably adaptively adjust the first gate-source voltage according to the sensing signal.

In one embodiment, the gate-source voltage adjustment circuit further includes: a second super source follower coupled between the sensor circuit and the first impedance circuit, wherein the second super source follower is configured to operably generate two summation currents according to a sensing current correlated with the sensing signal and a constant current; and a second impedance circuit coupled to the second super source follower; wherein the two summation currents flow through the first impedance circuit and the second impedance circuit, respectively, so as to adaptively adjust the first gate-source voltage.

In one embodiment, the first switch includes a first metal oxide semiconductor (MOS) device, and wherein the voltage difference is correlated with a drain-source voltage of the first MOS device, and wherein the conduction resistance is correlated with a channel resistance of the first MOS device when the first MOS device is in ON operation; wherein the sensing signal is proportional to a drain-source current of the first MOS device when the first MOS device is in ON operation; wherein the gate-source voltage adjustment circuit is configured to operably adaptively adjust the first gate-source voltage according to the voltage difference, so as to maintain the channel resistance of the first MOS device at the constant when the first MOS device is in ON operation.

In one embodiment, the first switch includes a first metal oxide semiconductor (MOS) device, whereas, the second switch includes a second MOS device, and wherein the voltage difference is correlated with a sum of a drain-source voltage of the first MOS device plus a drain-source voltage of the second MOS device; wherein the conduction resistance is correlated with a sum of a channel resistance of the first MOS device when the first MOS device is in ON operation plus a channel resistance of the second MOS device when the second MOS device is in ON operation; wherein the sensing signal is proportional to a drain-source current of the first MOS device when the first MOS device is in ON operation; wherein the gate-source voltage adjustment circuit is configured to operably adaptively adjust the first gate-source voltage according to the voltage difference, so as to maintain the sum of the channel resistance of the first MOS device plus the channel resistance of the second MOS device at the constant.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
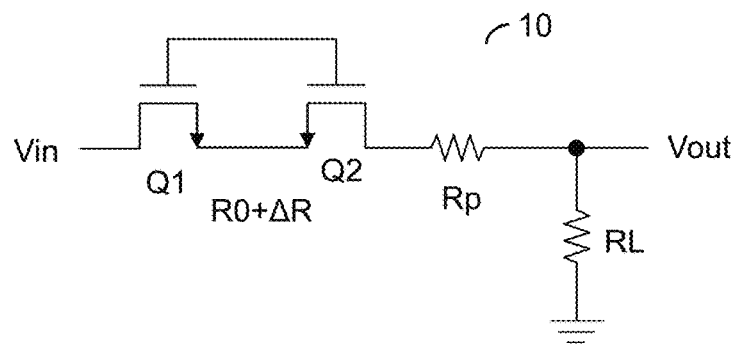
FIG. 1 shows a schematic diagram of a conventional analog switch circuit 10.
Figure 2A:
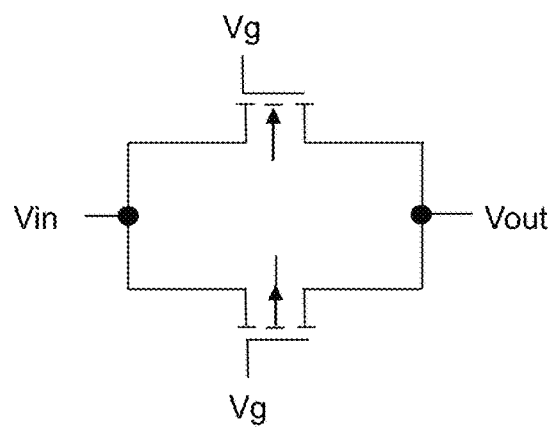
FIG. 2A shows a schematic diagram of a conventional analog switch circuit 20 constituted by PMOS and NMOS devices.
Figure 2B:
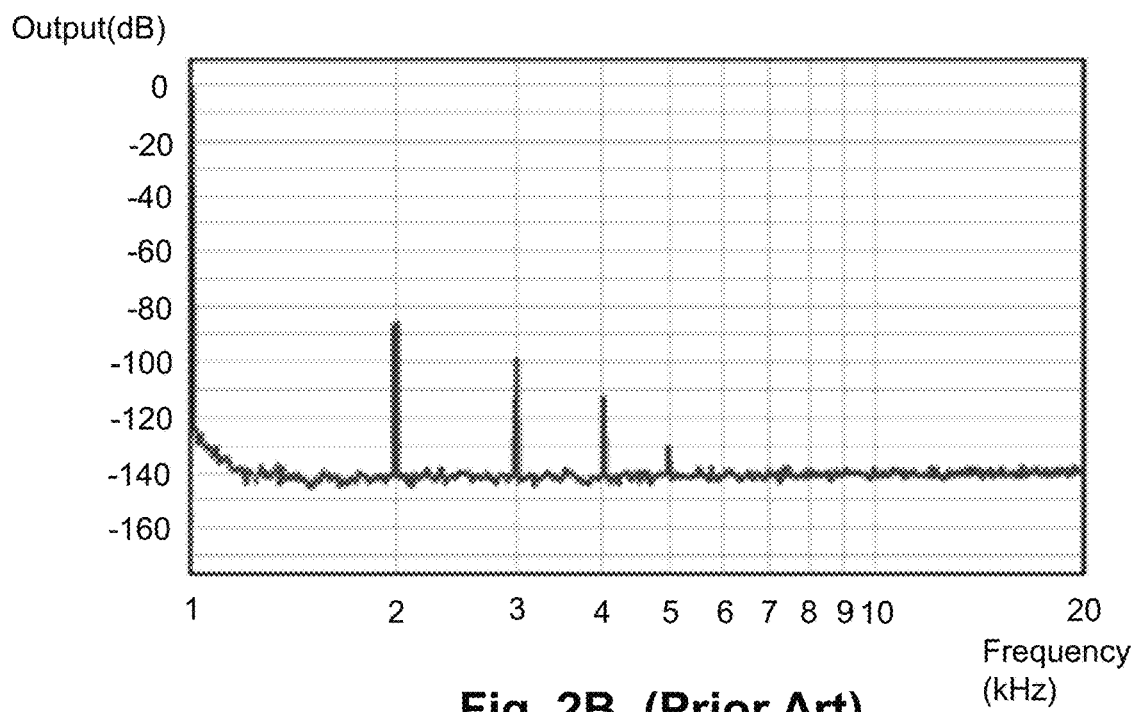
FIG. 2B illustrates the harmonic distortion of the output signal Vout of the conventional analog switch circuit 20 of FIG. 2A.
Figure 3A:
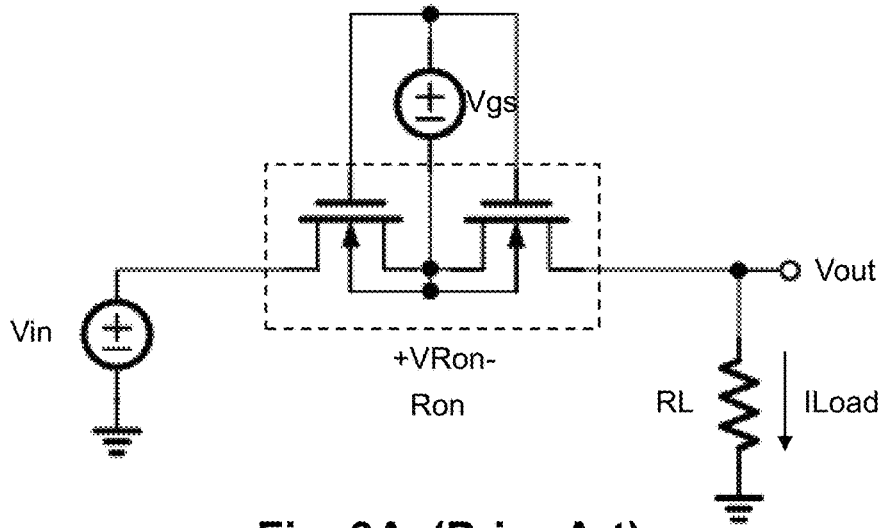
FIG. 3A shows a schematic diagram of a conventional analog switch circuit 30.
Figure 3B:
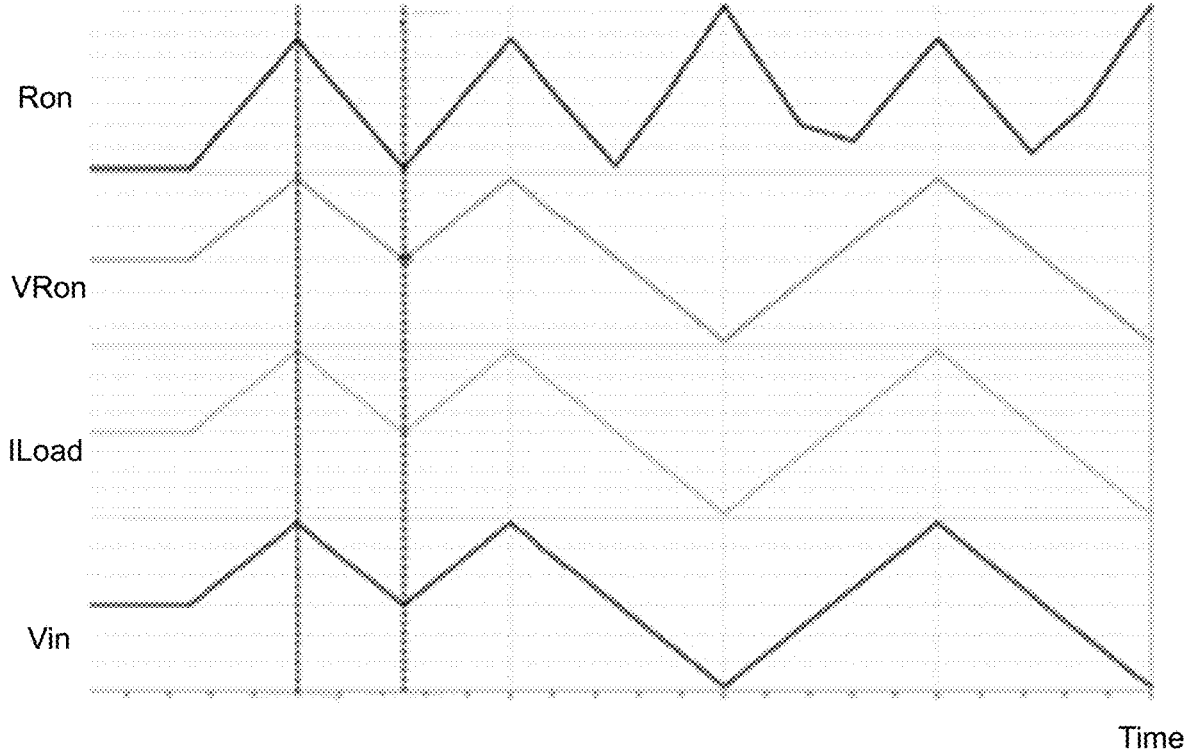
FIG. 3B shows a simulation schematic diagram of electrical characteristics of the conventional analog switch circuit 30 of FIG. 3A.
Figure 3C:
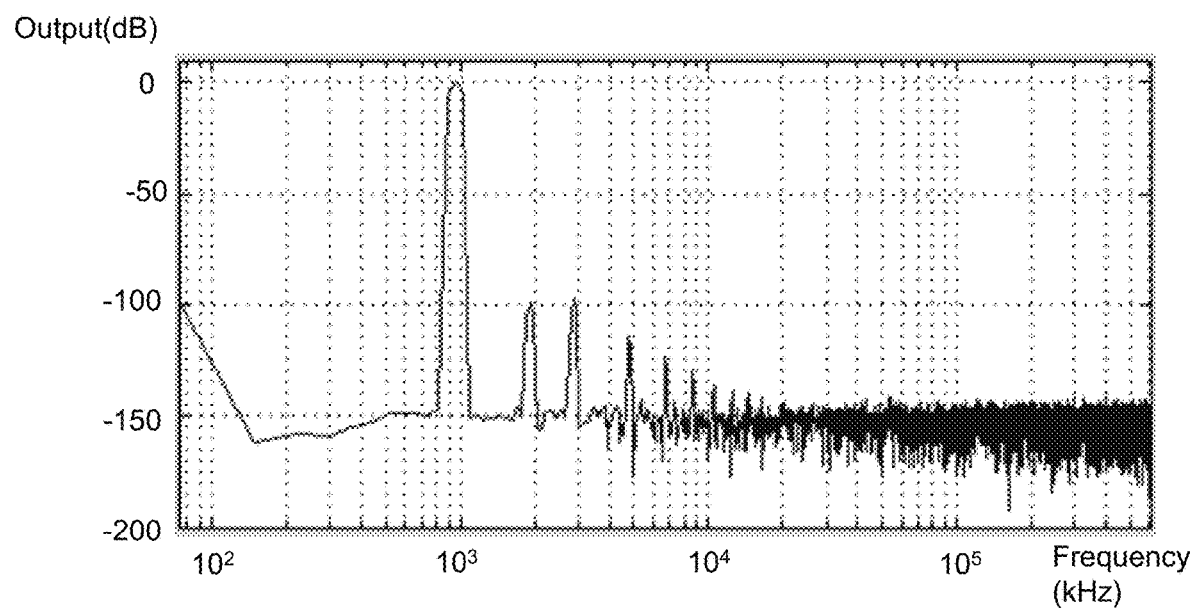
FIG. 3C illustrates the harmonic distortion of the output signal Vout of the conventional analog switch circuit 30 of FIG. 3A.
Figure 4A:
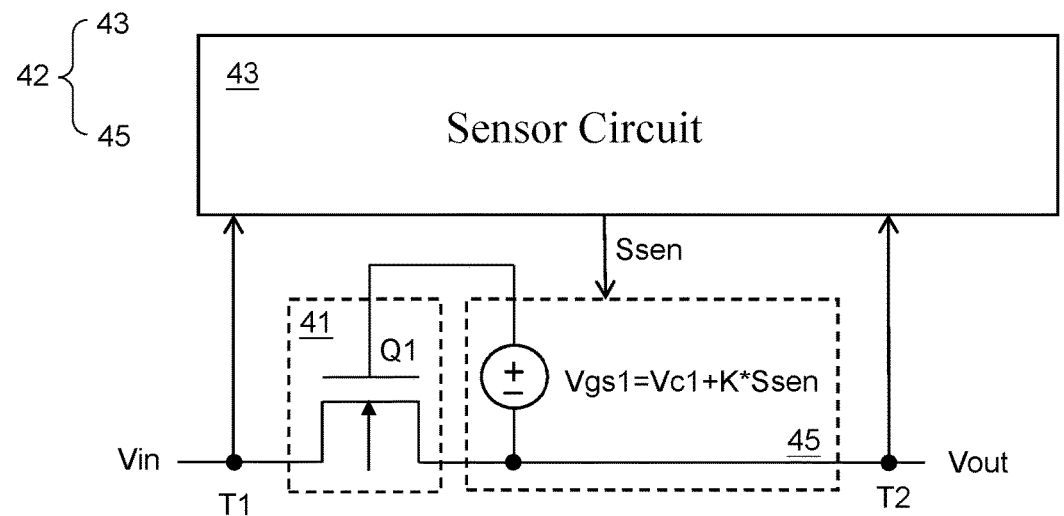
FIG. 4A shows a schematic diagram of an analog switch circuit 40 according to an embodiment of the present invention.
Figure 4B:
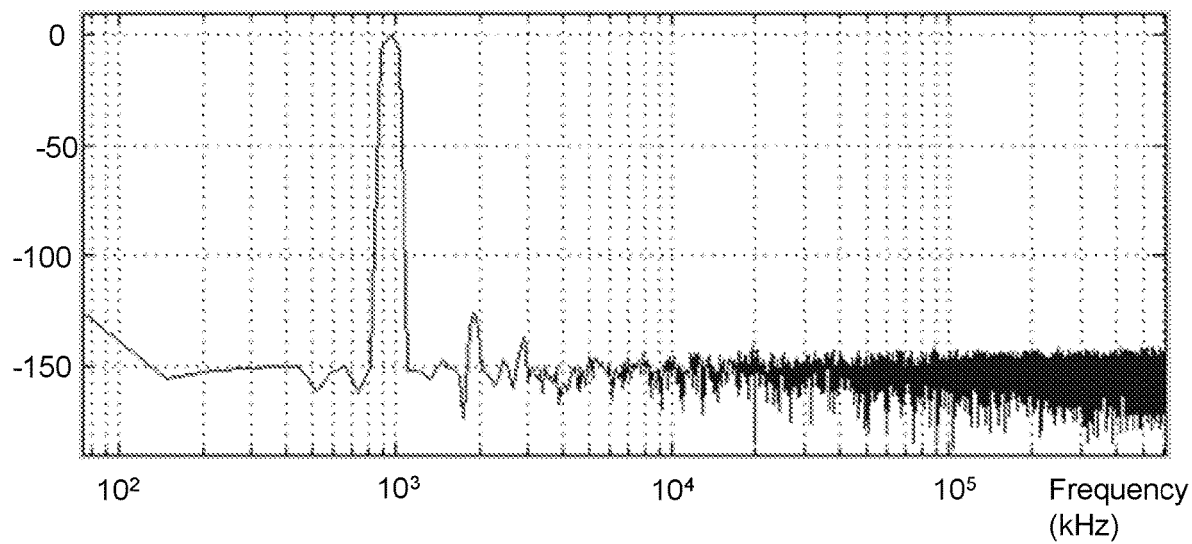
FIG. 4B illustrates a simulation schematic diagram depicting the harmonic distortion of the output signal Vout of the analog switch circuit 40 of FIG. 4A.

Please refer to FIG. 4A and FIG. 4B. FIG. 4A shows a schematic diagram of an analog switch circuit 40 according to an embodiment of the present invention. FIG. 4B illustrates a simulation schematic diagram depicting the harmonic distortion of the output signal Vout of the analog switch circuit 40 of FIG. 4A. The analog switch circuit 40 comprises: a switch unit 41 and a control circuit 42. The control circuit 42 includes: a sensor circuit 43 and a gate-source voltage adjustment circuit 45. As shown in FIG. 4A, the switch unit 41 is configured to operate a first switch Q1 therein according to a first gate-source voltage Vgs1 of the first switch Q1, so as to convert an input signal Vin of an input terminal T1 to the output signal Vout of an output terminal T2. The sensor circuit 43 is coupled between the input terminal T1 and the output terminal T2. The sensor circuit 43 is configured to operably generate a sensing signal Ssen according to a voltage difference between the input signal Vin and the output signal Vout. The gate-source voltage adjustment circuit 45 is coupled to the sensor circuit 43 and is configured to adaptively adjust the first gate-source voltage Vgs1 according to the sensing signal Ssen, so as to maintain the conduction resistance of the switch unit 41 at a constant while the voltage difference changes.

In this embodiment, the first switch Q1 is for example an N type metal oxide semiconductor (MOS) device (i.e., NMOS device). The above-mentioned voltage difference is correlated with a drain-source voltage of the NMOS device. The above-mentioned conduction resistance is correlated with a channel resistance of the NMOS device when the NMOS device is in ON operation. In one embodiment, the above-mentioned voltage difference is equal to the drain-source voltage of the NMOS device. In one embodiment, the above-mentioned conduction resistance is equal to the channel resistance of the NMOS device when the NMOS device is in ON operation. The sensing signal Ssen is proportional to a drain-source current of the NMOS device when the first MOS device is in ON operation. The gate-source voltage adjustment circuit 45 is configured to adaptively adjust the first gate-source voltage Vgs1 according to the above-mentioned voltage difference, so as to maintain the channel resistance of the NMOS device at a constant when the NMOS device is in ON operation. For example, as shown in FIG. 4A, the first gate-source voltage Vgs1 is for example equal to a sum of a constant voltage Vc1 plus a product of a parameter K multiplied by the sensing signal Ssen, wherein the parameter K can be a constant or an adjustable variable which is set or adjusted according to a user's requirement or according to a condition of the harmonic distortion.

In this embodiment, the gate-source voltage adjustment circuit 45 is coupled to the sensor circuit 43, and an output of the gate-source voltage adjustment circuit 45 is coupled between a gate and a source of a MOS device of the first switch Q1. In an implementation wherein the first switch Q1 is an NMOS device, when a voltage difference of the input signal Vin minus the output signal Vout has a positive sign, the gate-source voltage adjustment circuit 45 is coupled between the gate of the NMOS device and the output terminal T2, as shown in FIG. 4A. On the other hand, when a voltage difference of the input signal Vin minus the output signal Vout has a negative sign, the gate-source voltage adjustment circuit 45 is coupled between the gate of the NMOS device and the input terminal T1 (not shown in FIG. 4A). In another embodiment, a selection switch can be employed, which selectively connects the output terminal of the gate-source voltage adjustment circuit 45 to the output terminal T2 or the input terminal T1 according to the voltage difference of the input signal Vin minus the output signal Vout.

The drawback of the prior art is that when the input signal and the output signal vary, the channel resistance variation ΔR changes to result in harmonic distortion ("channel resistance" is the conduction resistance in ON operation of a MOS device). In view of this, in the analog switch circuit of the present invention which uses a MOS device as the first switch Q1, the present invention senses a voltage difference between the input terminal and the output terminal and adjusts the gate-source voltage of the MOS device via feedback mechanism, to maintain the channel resistance at a constant. This embodiment controls the channel resistance by changing a voltage between the gate and the source (i.e., first gate-source voltage Vgs1 in this embodiment) of the MOS device. As shown in FIG. 4A, this embodiment feedback controls the first gate-source voltage Vgs1 of the MOS device according to a voltage difference between the input terminal T1 and the output terminal T2, to reduce the variation of the channel resistance. The first gate-source voltage Vgs1 of the MOS device can be determined according to the constant voltage Vc1 and the sensing signal Ssen, so as to adaptively adjust the first gate-source voltage Vgs1 of the MOS device to the target level. The sensing signal Ssen is correlated with a voltage difference between the input terminal Vin and the output terminal Vout. In this embodiment, the sensing signal Ssen is correlated with a voltage difference between the drain and the source of the MOS device. A simulation result is as shown in FIG. 4B. According to the simulation result of this embodiment, high order harmonic distortion can be greatly reduced by accurate compensation.

Figure 5:
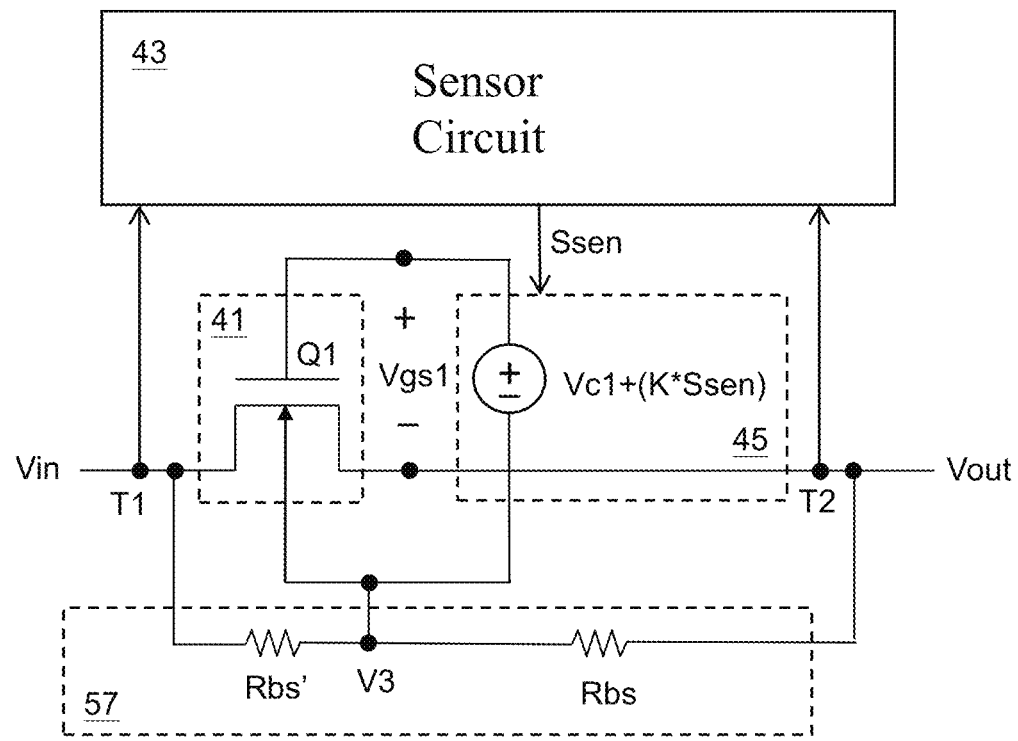
FIG. 5 shows a schematic diagram of an analog switch circuit 50 according to an embodiment of the present invention.

Please refer to FIG. 5, which shows a schematic diagram of an analog switch circuit 50 according to an embodiment of the present invention. The analog switch circuit 50 of FIG. 5 is different from the analog switch circuit 40 of FIG. 4 in that: in the analog switch circuit 50 of FIG. 5, in addition to including a sensor circuit 43 and a gate-source voltage adjustment circuit 45, a control circuit 52 of the analog switch circuit 50 further includes a voltage divider circuit 57. The voltage divider circuit 57 is coupled between an input terminal T1 and an output terminal T2. The voltage divider circuit 57 is configured to operably divide a voltage difference between the input terminal Vin and the output terminal Vout, so as to generate a bulk-source divided voltage of a first switch Q1, and the gate-source voltage adjustment circuit 45 adaptively adjusts the first gate-source voltage Vgs1 further according to the bulk-source divided voltage. As one having ordinary skill in the art readily understands, the "bulk-source divided voltage" is a divided voltage generated by a resistor Rbs which lies between a bulk coupled to a MOS device and a source of the MOS device, as referring to the voltage divider circuit 57 in FIG. 5. Besides, as shown in FIG. 5, the gate-source voltage adjustment circuit 45 can be coupled between the bulk and the gate of the MOS device, and regardless whether the voltage difference of the input signal Vin minus the output signal Vout has a positive sign or a negative sign, the gate-source voltage adjustment circuit 45 can adaptively adjust the first gate-source voltage Vgs1 in both situations without changing the connection of the gate-source voltage adjustment circuit 45 to the input terminal T1 or to the output terminal 12, so that the conduction resistance of the switch unit 41 is maintained at a constant while the voltage difference changes, to thereby improve harmonic distortion.

As shown in FIG. 5, in this embodiment, the first gate-source voltage Vgs1 is equal to a sum of a constant voltage Vc1 plus a product of a parameter K multiplied by the sensing signal Ssen plus the above-mentioned bulk-source divided voltage, which can be represented by the following equation:

$$Vgs1 = Vc1 + (K \times Ssen) + V3 - Vout$$

(in this embodiment, the bulk-source divided voltage is V3–Vout). Given the fact that the sensing signal Ssen is equal to a difference of the input terminal Vin minus the output terminal Vout, it is derived that:

$$Vgs1 = Vc1 + (K \times Ssen) + V3 - Vout$$

$$Vgs1 = Vc1 + (K \times Ssen) + D \times (Vin - Vout)$$

wherein D=Rbs/(Rbs+Rbs'), wherein the resistance Rbs' denotes a resistance between the bulk and the drain of the MOS device of the first switch Q1, that is, D denotes a ratio of the resistance Rbs to the total resistance of the entire voltage division resistor group; the voltage V3 denotes a bulk voltage of the first switch Q1.

$$Vgs1 = Vc1 + K \times (Vin - Vout) + D \times (Vin - Vout)$$
$$= Vc1 + K' \times (Vin - Vout)$$
$$= Vc1 + K' \times Vdif$$

wherein $$K' = K + D$$

$$Vdif = Vin - Vout$$

That is, in this embodiment, the gate-source voltage adjustment circuit 45 generates and adaptively adjusts the first gate-source voltage Vgs1 according to the sensing signal Ssen generated by the voltage difference between the input terminal Vin and the output terminal Vout (in one embodiment, the sensing signal Ssen is equal to the voltage difference of the input terminal Vin minus the output terminal Vout), so as to maintain the conduction resistance of the switch unit 41 at a constant while the voltage difference changes.

In one embodiment, the parameter K is a real number greater than one. When the parameter K is greater than one, the gate-source voltage adjustment circuit 45 is not limited by the approach of using a voltage divider circuit constituted by passive devices such as resistors to adjust the first gate-source voltage Vgs1 by a divided voltage of a voltage difference Vdif between the input terminal Vin and the output terminal Vout. According to the embodiment of the present invention, the present invention can sense the voltage difference Vdif and adjust the first gate-source voltage Vgs1 via an active feedback control mechanism, to thereby more precisely maintain the conduction resistance of the switch unit 41 at a constant.

Figure 6:
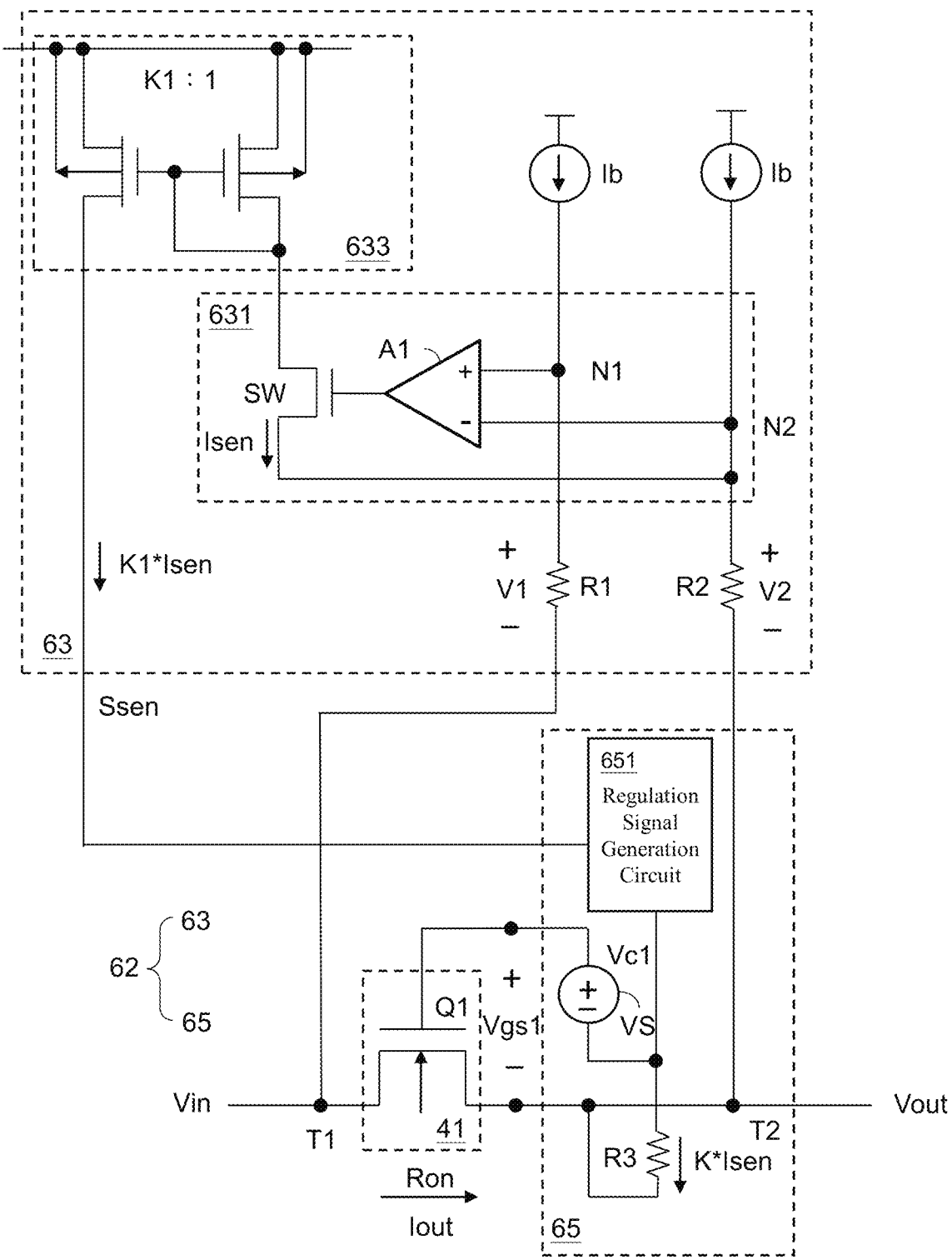
FIG. 6 shows a schematic diagram of an analog switch circuit 60 according to a specific embodiment of the present invention.

Please refer to FIG. 6, which shows a schematic diagram of an analog switch circuit 60 according to a specific embodiment of the present invention. In this embodiment, the analog switch circuit 60 comprises: a switch unit 41 and a control circuit 62. The control circuit 62 includes: a sensor circuit 63 and a gate-source voltage adjustment circuit 65. As shown in FIG. 6, the switch unit 41 is configured to operate a first switch Q1 therein according to a first gate-source voltage Vgs1 of the first switch Q1, so as to convert an input signal Vin of an input terminal T1 to the output signal Vout of an output terminal T2. The sensor circuit 63 is configured to operably generate a sensing signal Ssen according to a voltage difference Vdif between the input signal Vin and the output signal Vout. As shown in FIG. 6, in one embodiment, the sensing signal Ssen can be for example a current K1*Isen. The gate-source voltage adjustment circuit 65 is coupled to the sensor circuit 63 and is configured to adaptively adjust the first gate-source voltage Vgs1 according to the sensing signal Ssen, so as to maintain the conduction resistance of the switch unit 41 at a constant while the voltage difference Vdif changes.

As shown in FIG. 6, in one embodiment, the parameter K1 is equal to one whereby the sensing signal Ssen is the sensing current Isen. Under such situation, a regulation signal generation circuit 651 receives the sensing current Isen and generates a current K*Isen flowing through a resistor R3, thereby generating a voltage difference K*Isen*R3. Under such circumstance, Vgs1=Vc1+K*Isen*R3.

This embodiment shows a specific embodiment of the sensor circuit 63. The sensor circuit 63 includes: an amplifier circuit 631, a current mirror circuit 633, a first resistor R1 and a second resistor R2. The amplifier circuit 631 has a first input terminal N1 coupled to the input terminal T1 and a second input terminal N2 coupled to the output terminal T2. The amplifier circuit 631 regulates a voltage at the first input terminal N1 and a voltage at the second input terminal N2 to be the same level by a negative feedback control mechanism. The first resistor R1 is coupled between the first input terminal T1 and the input terminal N1. The second resistor R2 is coupled between the second input terminal N2 and the output terminal T2. The amplifier circuit 631 generates a sensing current Isen, wherein the sensing signal Ssen is proportional to the sensing current Isen. The current mirror circuit 633 is configured to operably duplicate and amplify the sensing current Isen, so as to generate the sensing signal Ssen. In this embodiment, the current mirror circuit 633 amplifies the sensing current Isen by K1-fold to generate a current K1*Isen to be the sensing signal Ssen. The amplifier circuit 631 includes an amplifier A1 which can be implemented via numerous ways, and a specific embodiment thereof will be described later.

The gate-source voltage adjustment circuit 65 is coupled to the sensor circuit 63 and is configured to adaptively adjust the first gate-source voltage Vgs1 according to the current K1*Isen (which serves as the sensing signal Ssen), so as to maintain the conduction resistance of the switch unit 41 at a constant while the voltage difference Vdif changes.

In this embodiment, the gate-source voltage adjustment circuit 65 includes: a regulation signal generation circuit 651, a voltage source VS and a resistor R3. In this embodiment, the regulation signal generation circuit 651 generates a current K*Isen flowing through the resistor R3, so as to generate a voltage difference K*Isen*R3. Thus, the first gate-source voltage Vgs1 is equal to a sum of a constant voltage Vc1 plus the voltage difference K*Isen*R3. The current K*Isen is correlated with the voltage difference Vdif between the input terminal Vin and the output terminal Vout. Consequently, the regulation signal generation circuit 651 can adaptively adjust the first gate-source voltage Vgs1 according to the voltage difference Vdif, so as to maintain the conduction resistance of the switch unit 41 at a constant while the voltage difference Vdif changes. The resistor R3 is coupled between the gate and source of the first switch Q1, to adaptively adjust the first gate-source voltage Vgs1 according to the sensing signal.

As shown in FIG. 6, each of two current sources provide a constant current Ib, wherein the two constant currents Ib and Ib flow through the first resistor R1 and the second resistor R2, respectively. The voltage difference across two ends of the first resistor R1 is equal to V1, whereas, the voltage difference across two ends of the second resistor R2 is equal to V2. The amplifier circuit 631 regulates a voltage at the first input terminal N1 and a voltage at the second input terminal N2 to be the same level by a negative feedback control mechanism. Assuming that the first switch Q1 has a channel resistance of Ron, the output current flowing through the first switch Q1 is equal to Iout, and the resistance R1 is equal to the resistance R2, under such situation, the negative feedback control mechanism of the amplifier circuit 631 can be represented by the following equations:

$$V1 + Iout \times Ron = V2$$

$$Ib \times R1 + Iout \times Ron = Isen \times R2 + Ib \times R2$$

$$Ib \times R1 + Iout \times Ron = Isen \times R1 + Ib \times R1$$

$$Isen = \frac{Iout \times Ron}{R1}$$

Therefore, the first gate-source voltage Vgs1 can be represented by the following equation:

$$Vgs1 = Vc1 + K \times \frac{Iout \times Ron}{R1} \times R3$$

In a case when the resistance R3 is equal to the resistance R1, the first gate-source voltage Vgs1 can be represented by the following equations:

$$Vgs1 = Vc1 + K \times \frac{Iout \times Ron}{R1} \times R3$$

$$Vgs1 = Vc1 + K \times Iout \times Ron$$

$$Vgs1 = Vc1 + K \times Vdif$$

The above-mentioned equations demonstrate that the sensor circuit 63 regulates the voltage at the first input terminal N1 and the voltage at the second input terminal N2 to be the same level by a negative feedback control mechanism, so as to generate the sensing current Isen, wherein the sensing current Isen is correlated with the voltage difference Vdif between the input terminal Vin and the output terminal Vout. The gate-source voltage adjustment circuit 65 adjusts the first gate-source voltage Vgs1 according to the sensing current Isen, so as to maintain the conduction resistance of the switch unit 41 at a constant while the voltage difference Vdif changes.

In one embodiment, as shown in FIG. 6, the amplifier circuit 631 includes: a first super source follower. In one embodiment, the parameter K is a real number greater than one.

Figure 7:
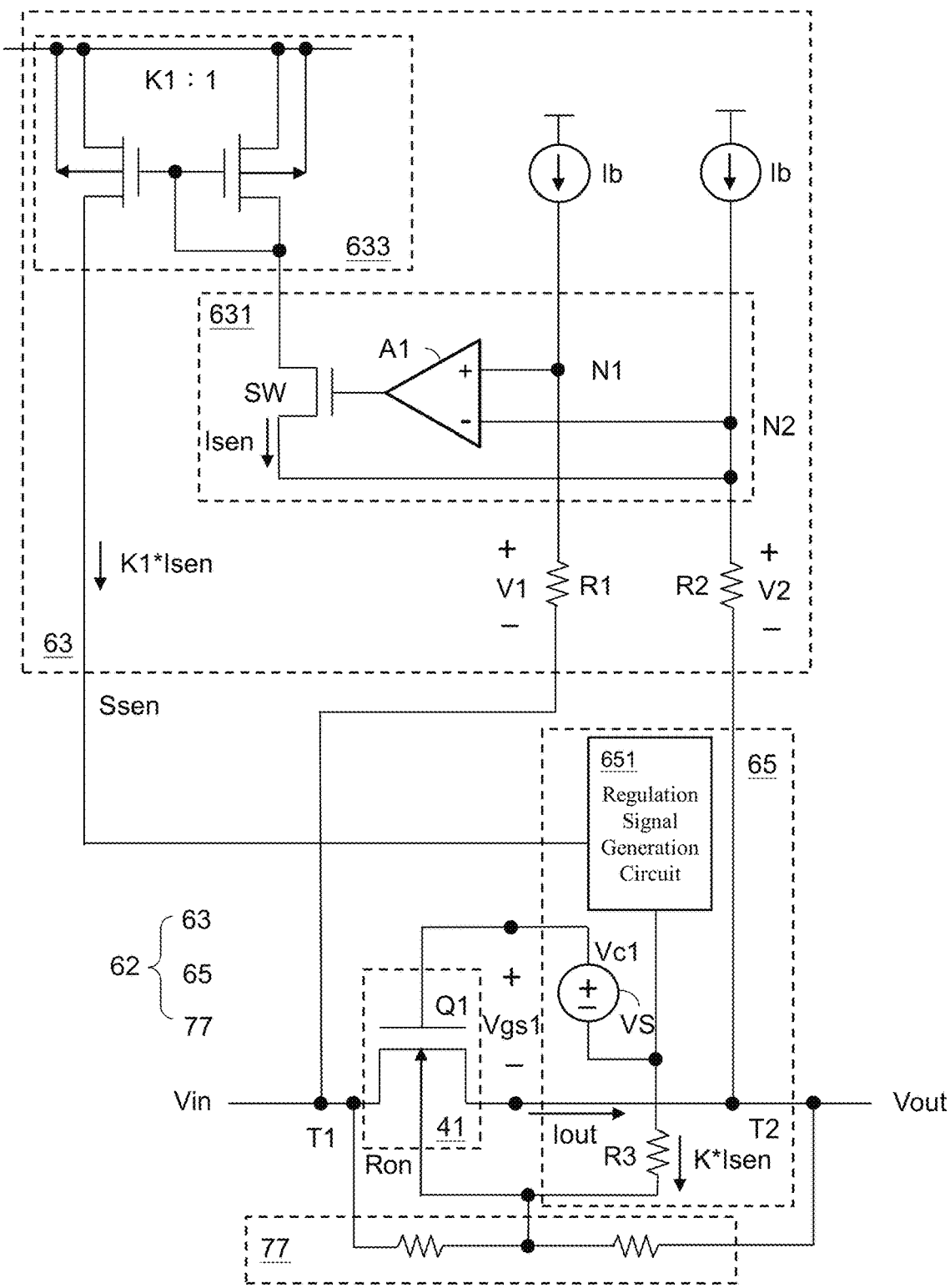
FIG. 7 shows a schematic diagram of an analog switch circuit 70 according to an embodiment of the present invention.

Please refer to FIG. 7, which shows a schematic diagram of an analog switch circuit 70 according to an embodiment of the present invention. In this embodiment, the analog switch circuit 70 of FIG. 7 is different from the analog switch circuit 60 of FIG. 6 in that: in the analog switch circuit 70 of FIG. 7, in addition to including a sensor circuit 63 and a gate-source voltage adjustment circuit 65, a control circuit 62 of the analog switch circuit 70 further includes a voltage divider circuit 77. The voltage-divider circuit 77 is coupled between an input terminal T1 and an output terminal T2. The voltage divider circuit 77 is configured to operably divide a voltage difference between the input terminal Vin and the output terminal Vout, so as to generate a bulk-source divided voltage of a first switch Q1, and the gate-source voltage adjustment circuit 65 adaptively adjusts the first gate-source voltage Vgs1 further according to the bulk-source divided voltage. Besides, as shown in FIG. 7, the gate-source voltage adjustment circuit 65 is coupled between the bulk and a gate of the first switch Q1. Thus, regardless whether the voltage difference of the input signal Vin minus the output signal Vout has a positive sign or a negative sign, the gate-source voltage adjustment circuit 65 can adaptively adjust the first gate-source voltage Vgs1 in both situations without changing the connection of the gate-source voltage adjustment circuit 65 to the input terminal T1 or to the output terminal T2, so that the conduction resistance of the switch unit 41 is maintained at a constant while the voltage difference changes, to thereby improve harmonic distortion.

Figure 8:
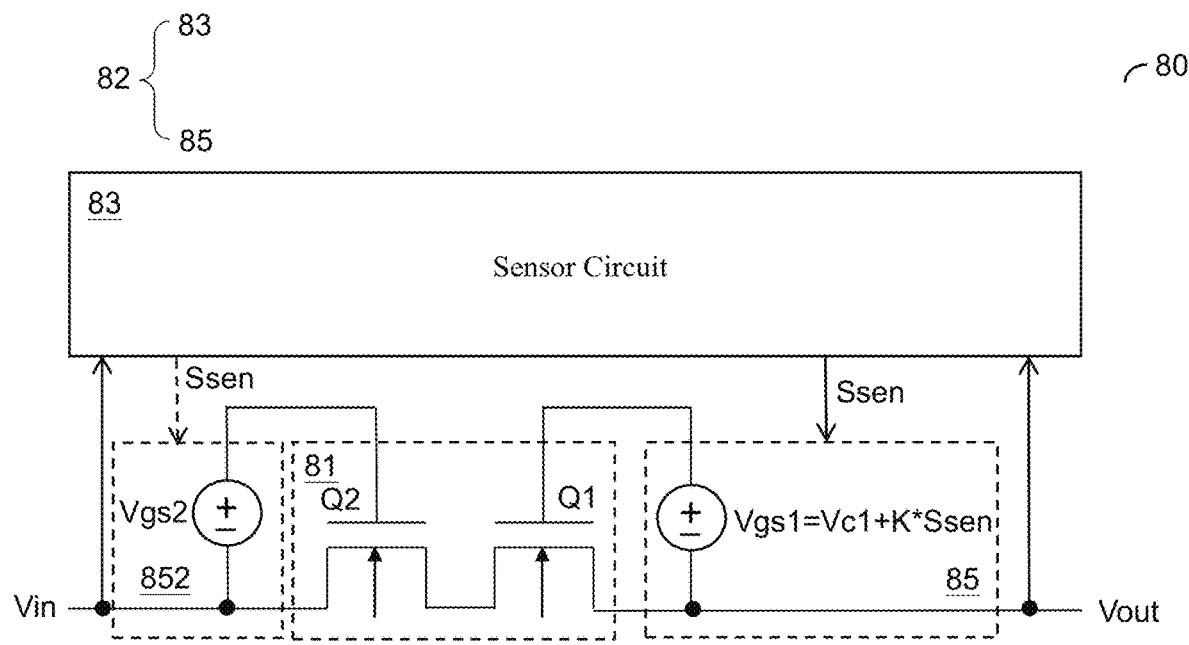
FIG. 8 shows a schematic diagram of an analog switch circuit 80 according to an embodiment of the present invention.

Please refer to FIG. 8, which shows a schematic diagram of an analog switch circuit 80 according to an embodiment of the present invention. The analog switch circuit 80 comprises: a switch unit 81 and a control circuit 82. The control circuit 82 includes: a sensor circuit 83 and a gate-source voltage adjustment circuit 85. As shown in FIG. 8, the switch unit 81 is configured to operate a first switch Q1 therein according to a first gate-source voltage Vgs1 of the first switch Q1 and is configured to operate a second switch Q2 therein according to a second gate-source voltage Vgs2 of the second switch Q2, so as to convert an input signal Vin of an input terminal T1 to the output signal Vout of an output terminal T2. The sensor circuit 83 is coupled between the input terminal T1 and the output terminal T2. The sensor circuit 83 is configured to operably generate a sensing signal Ssen according to a voltage difference between the input signal Vin and the output signal Vout. The gate-source voltage adjustment circuit 85 is coupled to the sensor circuit 83 and is configured to adaptively adjust the first gate-source voltage Vgs1 according to the sensing signal Ssen, so as to maintain the conduction resistance of the switch unit 81 at a constant while the voltage difference changes.

In this embodiment, the analog switch circuit 80 of FIG. 8 is different from the analog switch circuit 40 of FIG. 4A in that: in addition to the first switch Q1, the analog switch circuit 80 further includes a second switch Q2, wherein the first switch Q1 and the second switch Q2 are coupled in series between the input terminal T1 and the output terminal T2.

In one embodiment, as shown in FIG. 8, the gate-source voltage adjustment circuit 85 further includes a second regulation circuit 852. The second regulation circuit 852 generates a second gate-source voltage Vgs2 according to a sensing signal Ssen (as indicated by a dashed arrow in FIG. 8), wherein the second gate-source voltage Vgs2 serves to control the second switch Q2, to thereby maintain the conduction resistance of the switch unit 81 at a constant while the voltage difference changes. In one embodiment, the second gate-source voltage Vgs2 is a constant.

As shown in FIG. 8, in this embodiment, the first switch Q1 includes for example a first metal oxide semiconductor (MOS) device, such as an N type MOS device (i.e., NMOS device). The second switch Q2 includes for example a second MOS device, such as an N type MOS device (i.e., NMOS device). The above-mentioned voltage difference is correlated with a sum of a drain-source voltage of the first MOS device plus a drain-source voltage of the second MOS device. The above-mentioned conduction resistance is correlated with a sum of a channel resistance of the first MOS device when the first MOS device is in ON operation plus a channel resistance of the second MOS device when the second MOS device is in ON operation.

In one embodiment, the above-mentioned voltage difference is equal to a sum of the drain-source voltage of the first MOS device plus the drain-source voltage of the second MOS device. The above-mentioned conduction resistance is equal to a sum of the channel resistance of the first MOS device when the first MOS device is in ON operation plus the channel resistance of the second MOS device when the second MOS device is in ON operation. The sensing signal Ssen is proportional to a drain-source current of the first MOS device when the first MOS device and the second MOS device are both in ON operation. The gate-source voltage adjustment circuit is configured to operably adaptively adjust the first gate-source voltage Vgs1 according to the above-mentioned voltage difference (i.e., the sum of the drain-source voltage of the first MOS device plus the drain-source voltage of the second MOS device), so as to maintain the sum of the conduction resistance at the constant. For example, as shown in FIG. 8, the first gate-source voltage Vgs1 is for example equal to a sum of a constant voltage Vc1 plus a product of a parameter K multiplied by the sensing signal Ssen, wherein the parameter K can be a constant or an adjustable variable which is set or adjusted according to a user's requirement or according to a condition of the harmonic distortion.

Figure 9:
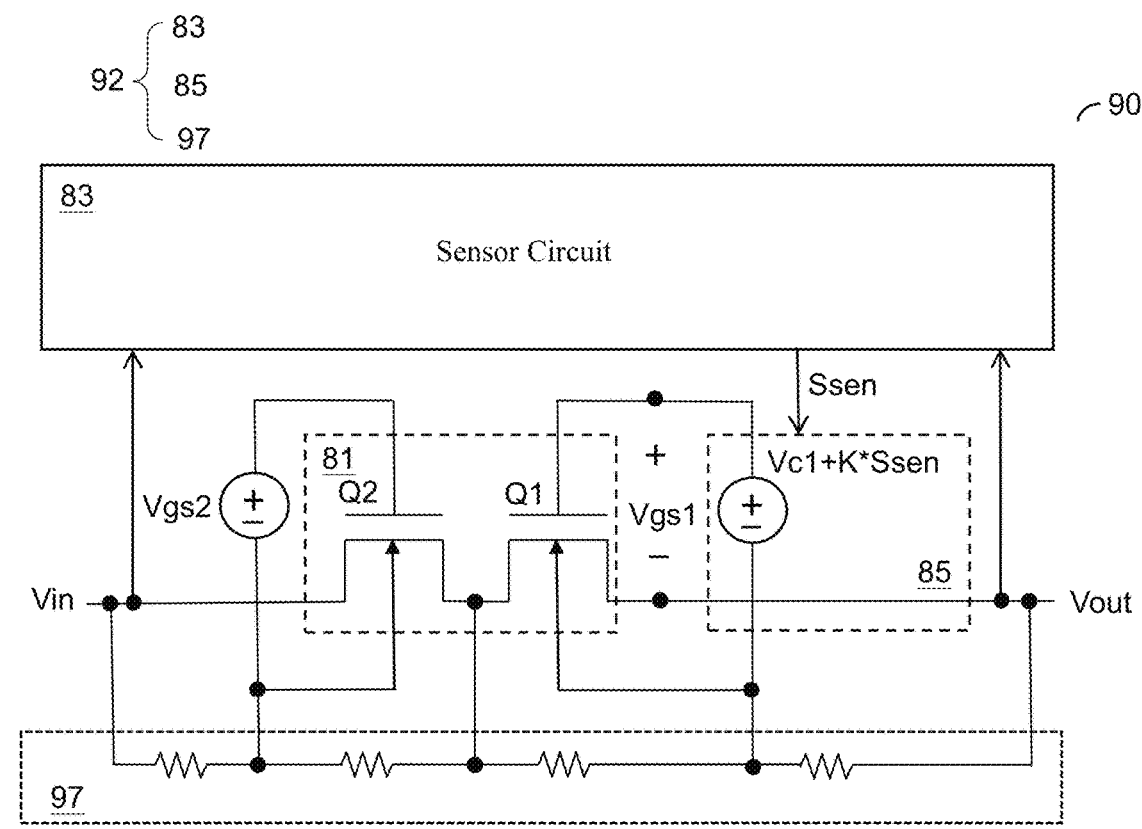
FIG. 9 shows a schematic diagram of an analog switch circuit 90 according to an embodiment of the present invention.

Please refer to FIG. 9, which shows a schematic diagram of an analog switch circuit 90 according to an embodiment of the present invention. The analog switch circuit 90 comprises: a switch unit 81 and a control circuit 92. The control circuit 92 includes: a sensor circuit 83, a gate-source voltage adjustment circuit 85 and a voltage divider circuit 97. As shown in FIG. 9, the switch unit 81 is configured to operate a first switch Q1 therein according to a first gate-source voltage Vgs1 of the first switch Q1 and to operate a second switch Q2 therein according to a second gate-source voltage Vgs2 of the second switch Q2, so as to convert an input signal Vin of an input terminal T1 to the output signal Vout of an output terminal T2. The sensor circuit 83 is coupled between the input terminal T1 and the output terminal T2. The sensor circuit is configured to operably generate a sensing signal Ssen according to a voltage difference between the input signal Vin and the output signal Vout. The gate-source voltage adjustment circuit 85 is coupled to the sensor circuit 83 and is configured to adaptively adjust the first gate-source voltage Vgs1 according to the sensing signal Ssen, so as to maintain the conduction resistance of the switch unit 81 at a constant while the voltage difference changes. The voltage divider circuit 97 is coupled between an input terminal T1 and an output terminal T2. The voltage divider circuit 97 is configured to operably divide a voltage difference between the input terminal Vin and the output terminal Vout, so as to generate a bulk-source divided voltage of a first switch Q1, so that the gate-source voltage adjustment circuit 85 adaptively adjusts the first gate-source voltage Vgs1 further according to the bulk-source divided voltage. In this embodiment, the second gate-source voltage Vgs2 for example can be a constant.

Figure 10:
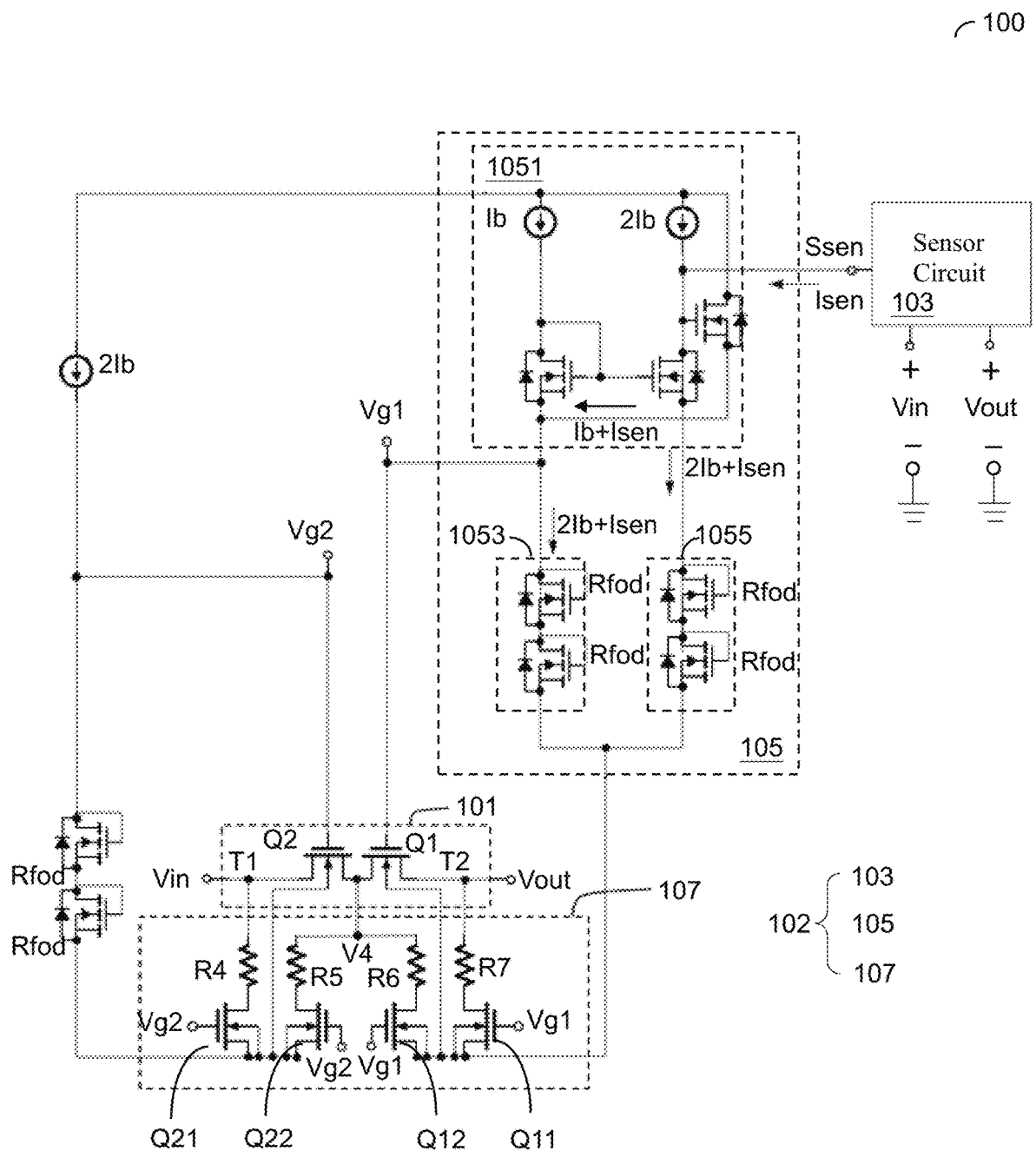
FIG. 10 shows a schematic diagram of an analog switch circuit 100 according to an embodiment of the present invention.

Please refer to FIG. 10, which shows a schematic diagram of an analog switch circuit 100 according to an embodiment of the present invention. The analog switch circuit 100 comprises: a switch unit 101 and a control circuit 102. The control circuit 92 includes: a sensor circuit 103, a gate-source voltage adjustment circuit 105 and a voltage divider circuit 107. As shown in FIG. 10, the switch unit 101 is configured to operate a first switch Q1 therein according to a first gate-source voltage Vgs1 of the first switch Q1 and is configured to operate a second switch Q2 therein according to a second gate-source voltage Vgs2 of the second switch Q2, so as to convert an input signal Vin of an input terminal T1 to the output signal Vout of an output terminal T2. The sensor circuit 103 is coupled between the input terminal T1 and the output terminal T2. The sensor circuit 103 is configured to operably generate a sensing signal Ssen according to a voltage difference between the input signal Vin and the output signal Vout. The gate-source voltage adjustment circuit 105 is coupled to the sensor circuit 103 and is configured to adaptively adjust the first gate-source voltage Vgs1 according to the sensing signal Ssen, so as to maintain the conduction resistance of the switch unit 101 at a constant while the voltage difference Vdif changes.

It is worthwhile mentioning that, the first gate voltage Vg1 shown in FIG. 10 is the voltage difference between the gate of the first switch Q1 (NMOS device in this embodiment) and the ground level. The second gate voltage Vg2 shown in FIG. 10 is the voltage difference between the gate of the second switch Q2 (NMOS device in this embodiment) and the ground level. As shown in FIG. 10, the input signal Vin and the output signal Vout are with reference to the ground level.

In this embodiment, the switch unit 101 includes: the first switch Q1 and the second switch Q2, wherein the first switch Q1 and the second switch Q2 are coupled in series between the input terminal T1 and the output terminal T2. As shown in FIG. 10, in one embodiment, the second switch Q2 is an NMOS device and is controlled by the second gate voltage Vg2, whereas, the first switch Q1 is an NMOS device and is controlled by the first gate voltage Vg1.

In one embodiment, in a case when Vin>Vout, the source of the first switch Q1 and the source of the second switch Q2 are at the right side which is the side nearer to the output signal Vout. The second gate-source voltage Vgs2 of the second switch Q2 can be represented by the following equation:

$$Vgs2 = 2Ib \times 2Rfod + VR5$$

$$Vgs2 = 2Ib \times 2Rfod + Vds2 \times \frac{R5}{R4+R5}$$

The first gate-source voltage Vgs1 of the first switch Q1 can be represented by the following equation:

$$Vgs1 = (2Ib + \text{Isen}) \times 2Rfod + VR7$$

$$Vgs1 = (2Ib + \text{Isen}) \times 2Rfod + Vds1 \times \frac{R7}{R6+R7}$$

In a case when the resistances of the resistor R4, the resistor R5, the resistor R6 and the resistor R7 are equal to one another, the following equations will be obtained:

$$Vgs2 = 2Ib \times 2Rfod + |Vds2| \times \tfrac{1}{2}$$

$$Vgs1 = (2Ib + \text{Isen}) \times 2Rfod + |Vds1| \times \tfrac{1}{2}$$

wherein |Vds2|+|Vds1|=|Vout−Vin|, in this equation the absolute value signs are given to take both cases Vin<Vout and Vin>Vout into consideration; wherein VR5 denotes a voltage difference across two ends of the first resistor R5, whereas, VR7 denotes a voltage difference across two ends of the second resistor R7; wherein Vds1 denotes the drain-source voltage of the first switch Q1, whereas, Vds2 denotes the drain-source voltage of the second switch Q2.

The second gate-source voltage Vgs2 is equal to the sum of the voltage drops of two resistors Rfod and Rfod plus the bulk-source divided voltage of the second switch Q2. In the case when Vin>Vout, the source is at the right side which is the side nearer to the output signal Vout; the bulk-source divided voltage is the voltage drop across the resistor R5, and the positive terminal is at the bulk. In the case when Vin<Vout, the source is at the left side which is the side nearer to the input signal Vin; the bulk-source divided voltage is the voltage drop across the resistor R4, and the positive terminal is at the bulk.

The second gate-source voltage Vgs2 of the second switch Q2 is equal to a difference of the second gate voltage Vg2 minus the input signal Vin, in the case when Vin<Vout; or, the second gate-source voltage Vgs2 of the second switch Q2 is equal to a difference of the second gate voltage Vg2 minus the voltage V4 (wherein the voltage V4 is the voltage at the node between the resistor R5 and the resistor R6), in the case when Vin>Vout.

The first gate-source voltage Vgs1 of the first switch Q1 is equal to a difference of the first gate voltage Vg1 minus the voltage V4, in the case when Vin<Vout; or, the first gate-source voltage Vgs1 of the first switch Q1 is equal to a difference of the first gate voltage Vg1 minus the output signal Vout, in the case when Vin>Vout.

In a case when the resistances of the resistor R4, the resistor R5, the resistor R6 and the resistor R7 are equal to one another, the equation having absolute values as shown above will be obtained.

As shown in FIG. 10, the voltage-divider circuit 107 includes four voltage division resistors R4-R7 connected in series between the input terminal T1 and the output terminal T2, and the voltage divider circuit 107 further includes a switch Q11, a switch Q12, a switch Q21, and a switch Q22. The switch Q11, the switch Q12, the switch Q21 and the switch Q22 are configured to concurrently turn OFF a current path between the input signal Vin and the output signal Vout through four voltage division resistors R4-R7 when the first switch Q1 and the second switch Q2 are controlled to be OFF. The switch Q11 is coupled between the source and the bulk of the first switch Q1. The switch Q12 is coupled between the drain and the bulk of the first switch Q1. The switch Q21 is coupled between the source and the bulk of the second switch Q2. The switch Q22 is coupled between a drain and the bulk of the second switch Q2. The switch Q11 and the switch Q12 are controlled by the first gate voltage Vg1. The switch Q21 and the switch Q22 are controlled by the second gate voltage Vg2. In a case when the first gate voltage Vg1 and the second gate voltage Vg2 control the first switch Q1 and the second switch Q2 to be OFF, the switch Q11, the switch Q12, the switch Q21 and the switch Q22 are configured to prevent the input signal Vin of the input terminal T1 from being converted to output signal Vout of the output terminal T2 via the four voltage division resistors R4-R7.

This embodiment shows a specific embodiment of gate-source voltage adjustment circuit 105. The gate-source voltage adjustment circuit 105 includes: a super source follower 1051, a first impedance circuit 1053 and a second impedance circuit 1055. The super source follower 1051 is coupled between the sensor circuit 103 and the first impedance circuit 1053. The super source follower 1051 generates two summation currents 2Ib+Isen and 2Ib+Isen according to a sensing current Isen related to the sensing signal Ssen and constant currents Ib and 2Ib. The first impedance circuit 1053 is coupled between the gate of the first switch Q1 and the source of the first switch Q1, wherein the first impedance circuit 1053 is configured to operably adaptively adjust the first gate-source voltage Vgs1 according to the sensing signal Ssen. The second impedance circuit 1055 is coupled to the super source follower 1051. The two summation currents 2Ib+Isen and 2Ib+Isen flow through the first impedance circuit 1053 and the second impedance circuit 1055, respectively, so as to adaptively adjust the first gate-source voltage Vgs1.

In this embodiment, the super source follower 1051 is located at a top side of FIG. 10. In the super source follower 1051, two transistors whose gates are coupled to each other correspond to the amplifier A1 in the amplifier circuit shown in FIG. 6 and FIG. 7.

Figure 11:
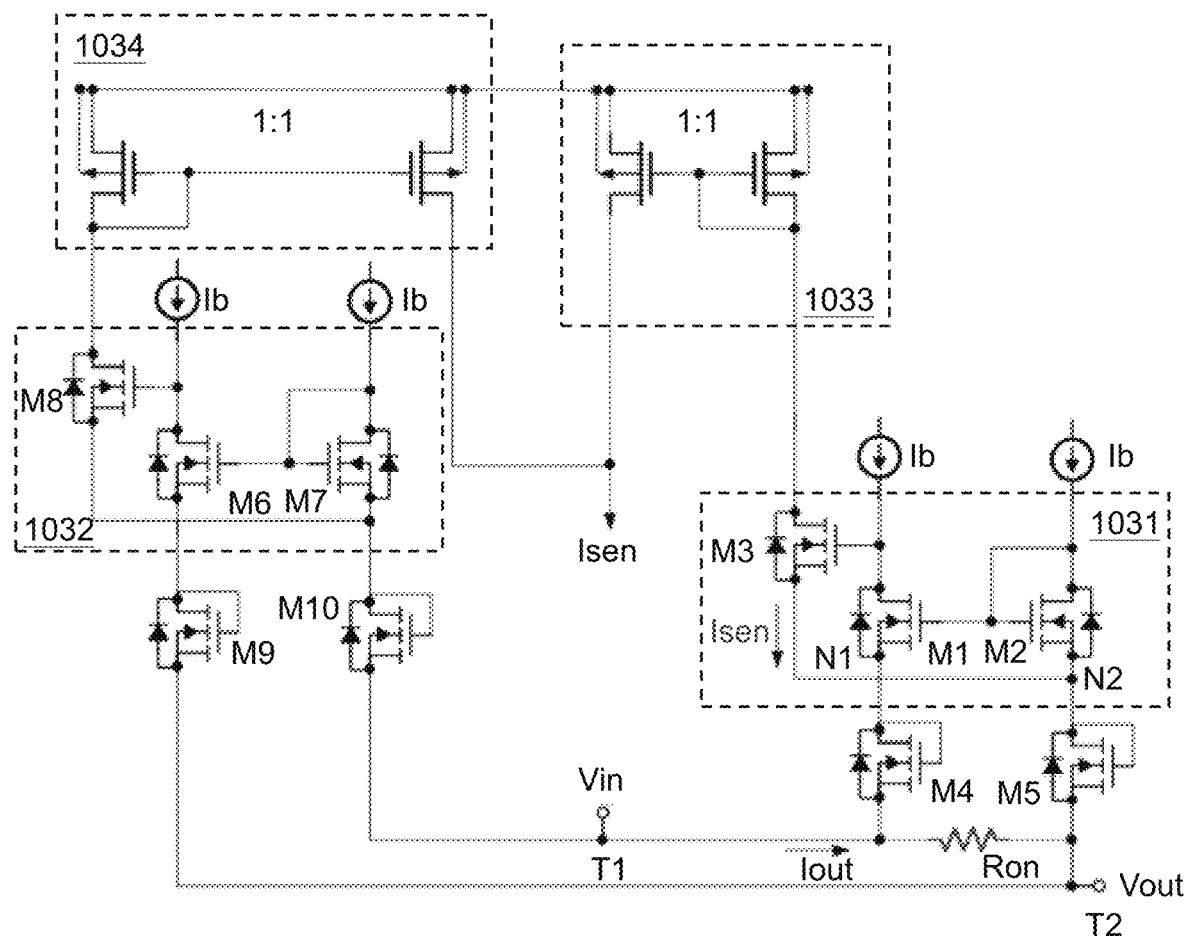
FIG. 11 shows a specific embodiment of a sensor circuit 103.
Figure 12A:
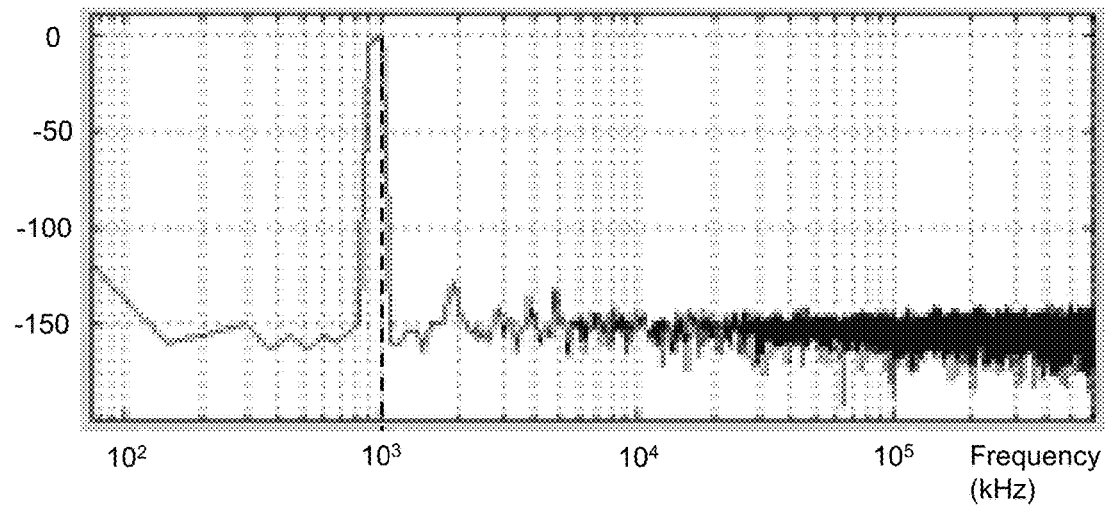
FIG. 12A to FIG. 12E illustrate a Fast Fourier Transform (FFT) simulation result depicting the harmonic distortion of the output signal Vout of the analog switch circuit of the present invention.
Figure 12B:
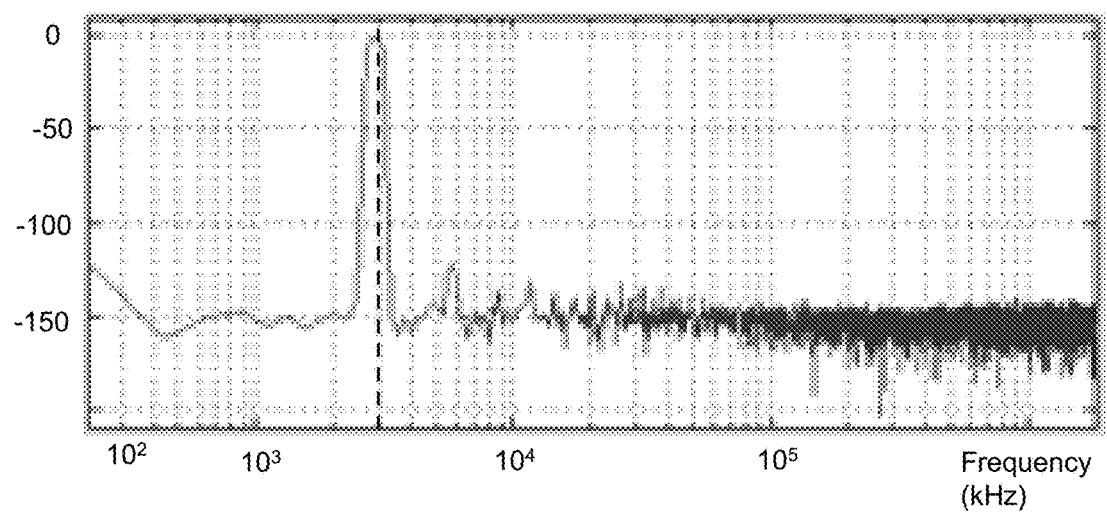
Figure 12C:
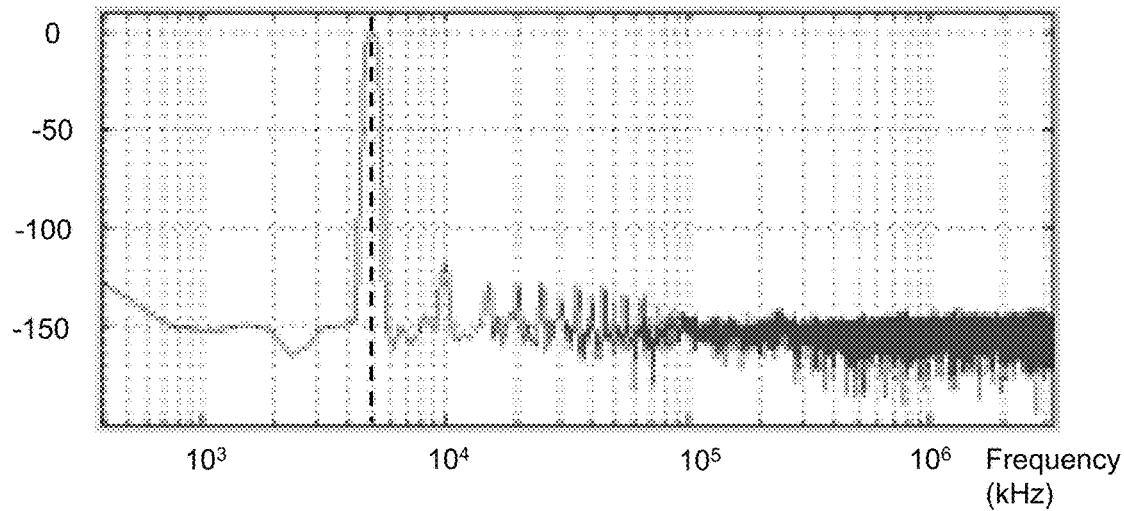
Figure 12D:
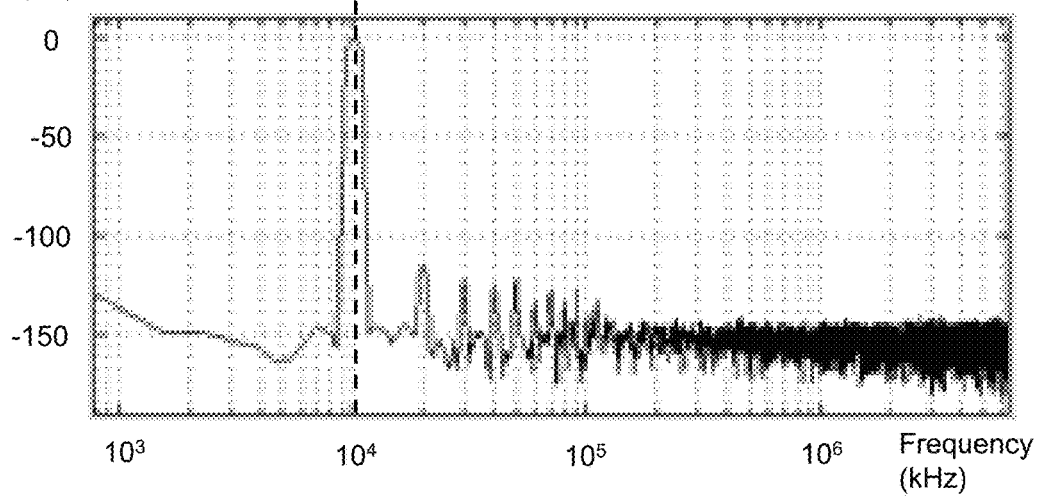
Figure 12E:
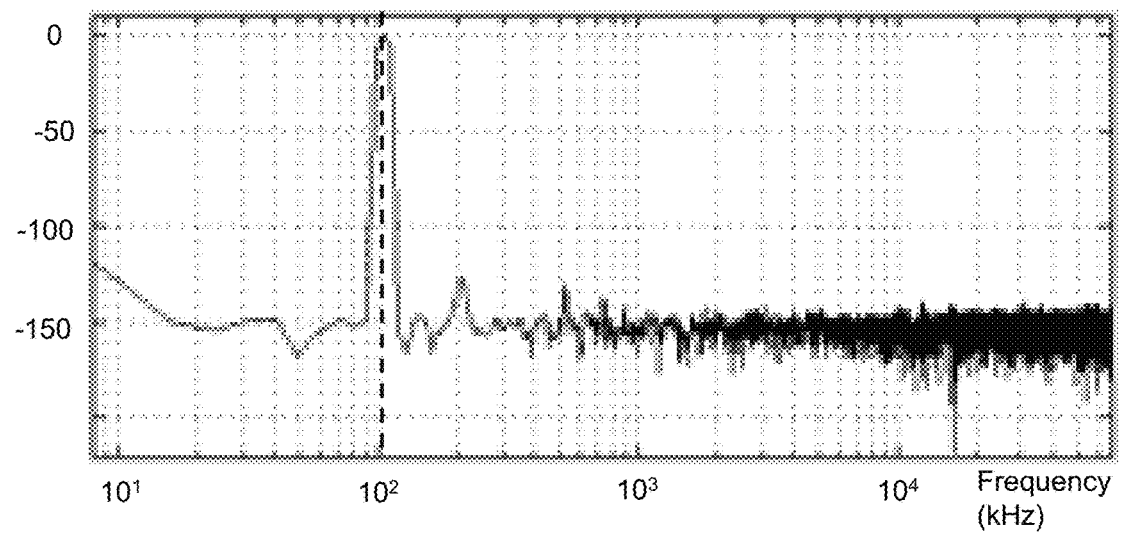

Please refer to FIG. 11, which shows a specific embodiment of a sensor circuit 103. As shown in FIG. 11, in this embodiment, switch devices M1, M2 and M3 together constitute a super source follower, which serves as an amplifier circuit 1031 having feedback control mechanism (referring to the amplifier circuit 631 in FIG. 6). By a negative feedback path provided by the switch device M3, a source of the switch device M1 (i.e., first input terminal N1) and a source of the switch device M2 (i.e., second input terminal N2) are regulated at the same voltage. Resistor devices M4 and M5 for example are field oxide devices to serve as resistors (referring to the first resistor R1 and the second resistor R2 in FIG. 6). In this embodiment, the channel resistance Ron indicates the conduction resistance of the switch unit. The amplifier circuit 1031 generates the sensing current Isen according to the voltage difference Vdif generated by an output current Iout flowing through the channel resistance Ron.

Switch devices M6, M7 and M8 together constitute another super source follower, which serve as an amplifier circuit 1032 having feedback control mechanism. by a negative feedback path provided by the switch device M8, a source of the switch device M6 (i.e., third input terminal N3) and a source of the switch device M7 (i.e., fourth input terminal N4) are regulated at the same voltage. Resistor devices M9 and M10 for example are field oxide devices to serve as resistors. The amplifier circuit 1032 serves as an amplifier circuit having feedback control mechanism in a case when the input signal Vin is smaller than the output signal Vout, so that regardless whether the input signal Vin is smaller than or not smaller than the output signal Vout, the sensor circuit 103 can operate. To be more specific, on one hand, when the input signal Vin is not smaller than the output signal Vout, the amplifier circuit 1031 generates the sensing current Isen according to the voltage difference Vdif generated by the output current Iout flowing through the channel resistance Ron. On the other hand, when the input signal Vin is smaller than the output signal Vout, the amplifier circuit 1032 generates the sensing current Isen according to the voltage difference Vdif generated by the output current Iout flowing through the channel resistance Ron.

In addition to including the amplifier circuit 1031 and 1032 and the resistor devices M4, M5, M9 and M10, the sensor circuit 103 further includes: a current mirror circuit 1033 and a current mirror circuit 1034. The current mirror circuits 1033 and 1034 for example mirror the sensing current Isen by 1-fold to generate the sensing signal Ssen which has the same level as the sensing current Isen. Certainly, the amplification ratio of the current mirror circuits 1033 and 1034 is not limited to 1:1. In other embodiments, it is also practicable and within the broadest scope of the present invention that the amplification ratio of the current mirror circuits 1033 and 1034 can be K which is not equal to one.

Assuming that the amplification ratio of the current mirror circuit 1033 to the current mirror circuit 1034 is 1, and the resistances of the resistor devices M4, M5, M9 and M10 are all equal to Ron, the sensing current Isen can be derived and represented by the following equation:

$$Rfod \times 2Ib + Ron|Iout| = Rfod \times Isen + Rfod \times 2Ib$$

$$Isen = \frac{Ron \times |Iout|}{Rfod}$$

The final equation indicates that the sensing current Isen of the sensing signal Ssen is proportional to the voltage difference Vdif generated by an output current Iout flowing through the channel resistance Ron.

Please refer to FIG. 12A to FIG. 12E, which illustrate a Fast Fourier Transform (FFT) simulation result depicting the harmonic distortion of the output signal Vout of the analog switch circuit of the present invention. As shown in FIG. 12A to FIG. 12E, according to the embodiments of the present invention, the second order or higher order FFT harmonic distortion is lower than −110 dB, which is better than the prior art. In FIG. 12A to FIG. 12E, the horizontal axis indicates a frequency of the input signal Vin and a frequency of the output signal Vout. As shown in FIG. 12A to FIG. 12E, according to the embodiments of the present invention, the second order or higher order FFT harmonic distortion at signal frequency of 1 KHz, 3 KHz, 5 KHz, 10 KHz and 0.1 KHz is lower than −110 dB.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. For example, the gate-source voltage adjustment circuit 105 shown in the embodiment of FIG. 10 can be correspondingly applied in the embodiments of FIGS. 4A, 5, 6, 7, 8 and 9. In view of the foregoing, the spirit of the present invention should cover all such and other modifications and variations, which should be interpreted to fall within the scope of the following claims and their equivalents.

What is claimed is:

1. An analog switch circuit, comprising:
a switch unit including a first switch, wherein the first switch is coupled to a current path formed between an input terminal and an output terminal, and wherein the first switch is configured to operably convert an input signal of the input terminal to an output signal of the output terminal according to a first gate-source voltage of the first switch; and
a control circuit including:
a sensor circuit coupled between the input terminal and the output terminal, wherein the sensor circuit is configured to operably generate a sensing signal according to a voltage difference between the input signal and the output signal;
a gate-source voltage adjustment circuit coupled to the sensor circuit, wherein the gate-source voltage adjustment circuit is configured to operably generate and adaptively adjust the first gate-source voltage according to the sensing signal, so as to maintain a conduction resistance of the switch unit at a constant while the voltage difference changes; and
a voltage divider circuit coupled between the input terminal and the output terminal, wherein the voltage divider circuit is configured to operably provide a bulk-source divided voltage into the voltage difference, so that the gate-source voltage adjustment circuit adaptively adjusts the first gate-source voltage further according to the bulk-source divided voltage.

2. The analog switch circuit of claim 1, wherein the switch unit further includes a second switch, wherein the first switch and the second switch are coupled in series between the input terminal and the output terminal.

3. The analog switch circuit of claim 1, wherein a relationship between the first gate-source voltage and the voltage difference is represented by a following equation:

$$Vgs1 = Vc1 + K \times Vdif$$

wherein the first gate-source voltage Vgs1 is equal to a sum of a constant voltage Vc1 plus a product of the voltage difference Vdif multiplied by a coefficient K;
wherein the coefficient K is a real number greater than one.

4. The analog switch circuit of claim 2, wherein the gate-source voltage adjustment circuit is further configured to operably generate a second gate-source voltage of the second switch according to the sensing signal, so as to control the second switch, to thereby maintain the conduction resistance of the switch unit at the constant while the voltage difference changes.

5. The analog switch circuit of claim 4, wherein the second gate-source voltage is a constant.

6. The analog switch circuit of claim 2, wherein the control circuit further includes: a voltage divider circuit coupled between the input terminal and the output terminal, wherein voltage divider circuit is configured to operably provide a bulk-source divided voltage into the voltage difference, so that the gate-source voltage adjustment circuit adaptively adjusts the first gate-source voltage further according to the a bulk-source divided voltage.

7. The analog switch circuit of claim 1, wherein the sensor circuit includes:
an amplifier circuit having a first amplifier input terminal and a second amplifier input terminal;
a first resistor coupled between the first amplifier input terminal and the input terminal; and
a second resistor coupled between the second amplifier input terminal and the output terminal;
wherein the amplifier circuit regulates a voltage at the first amplifier input terminal and a voltage at the amplifier second input terminal to be a same level by a negative feedback control mechanism;
wherein the amplifier circuit generates an amplification current, and wherein the sensing signal is proportional to the amplification current.

8. The analog switch circuit of claim 7, wherein the sensor circuit further includes:
a current mirror circuit, which is configured to operably duplicate and amplify the amplification current, so as to generate the sensing signal.

9. The analog switch circuit of claim 7, wherein the amplifier circuit includes: a first super source follower.

10. The analog switch circuit of claim 1, wherein the gate-source voltage adjustment circuit includes:
a first impedance circuit coupled between a first gate of the first switch and a first source of the first switch, wherein the first impedance circuit is configured to operably adaptively adjust the first gate-source voltage according to the sensing signal.

11. The analog switch circuit of claim 10, wherein the gate-source voltage adjustment circuit further includes:
a super source follower coupled between the sensor circuit and the first impedance circuit, wherein the super source follower is configured to operably generate two summation currents according to a sensing current correlated with the sensing signal and a constant current; and
a second impedance circuit coupled to the super source follower;
wherein the two summation currents flow through the first impedance circuit and the second impedance circuit, respectively, so as to adaptively adjust the first gate-source voltage.

12. The analog switch circuit of claim 1, wherein the first switch includes a first metal oxide semiconductor (MOS)

device, and wherein the voltage difference is correlated with a drain-source voltage of the first MOS device, and wherein the conduction resistance is correlated with a channel resistance of the first MOS device when the first MOS device is in ON operation; wherein the sensing signal is proportional to a drain-source current of the first MOS device when the first MOS device is in ON operation; wherein the gate-source voltage adjustment circuit is configured to operably adaptively adjust the first gate-source voltage according to the voltage difference, so as to maintain the channel resistance of the first MOS device at the constant when the first MOS device is in ON operation.

13. The analog switch circuit of claim 2, wherein the first switch includes a first metal oxide semiconductor (MOS) device, whereas the second switch includes a second MOS device, and wherein the voltage difference is correlated with a sum of a drain-source voltage of the first MOS device plus a drain-source voltage of the second MOS device; wherein the conduction resistance is correlated with a sum of a channel resistance of the first MOS device when the first MOS device is in ON operation plus a channel resistance of the second MOS device when the second MOS device is in ON operation; wherein the sensing signal is proportional to a drain-source current of the first MOS device when the first MOS device is in ON operation; wherein the gate-source voltage adjustment circuit is configured to operably adaptively adjust the first gate-source voltage according to the voltage difference, so as to maintain the sum of the channel resistance of the first MOS device plus the channel resistance of the second MOS device at the constant.

14. A control circuit of an analog switch circuit, comprising:
a sensor circuit coupled between an input terminal and an output terminal, wherein the sensor circuit is configured to operably generate a sensing signal according to a voltage difference between an input signal of the input terminal and an output signal of the output terminal;
a gate-source voltage adjustment circuit coupled to the sensor circuit, wherein the gate-source voltage adjustment circuit is configured to operably generate and adaptively adjust a first gate-source voltage according to the sensing signal, so as to operate a first switch in a switch unit of the analog switch circuit, thereby converting the input signal to the output signal and thereby maintaining a conduction resistance of the switch unit at a constant while the voltage difference changes; and
a voltage divider circuit coupled between the input terminal and the output terminal, wherein the voltage divider circuit is configured to operably provide a bulk-source divided voltage into the voltage difference, so that the gate-source voltage adjustment circuit adaptively adjusts the first gate-source voltage further according to the bulk-source divided voltage;
wherein the first switch is coupled in a current path formed between the input terminal and the output terminal.

15. The control circuit of claim 14, wherein the switch unit further includes a second switch, wherein the first switch and the second switch are coupled in series between the input terminal and the output terminal.

16. The control circuit of claim 14, wherein a relationship between the first gate-source voltage and the voltage difference is represented by a following equation:

$$Vgs1 = Vc1 + K \times Vdif$$

wherein the first gate-source voltage Vgs1 is equal to a sum of a constant voltage Vc1 plus a product of the voltage difference Vdif multiplied by a coefficient K; wherein the coefficient K is a real number greater than one.

17. The control circuit of claim 15, wherein the gate-source voltage adjustment circuit is further configured to operably generate a second gate-source voltage of the second switch according to the sensing signal, so as to control the second switch, to thereby maintain the conduction resistance of the switch unit at the constant while the voltage difference changes.

18. The control circuit of claim 17, wherein the second gate-source voltage is a constant.

19. The control circuit of claim 15, wherein the control circuit further includes: a voltage divider circuit coupled between the input terminal and the output terminal, wherein voltage divider circuit is configured to operably provide a bulk-source divided voltage into the voltage difference, so that the gate-source voltage adjustment circuit adaptively adjusts the first gate-source voltage further according to the a bulk-source divided voltage.

20. The control circuit of claim 14, wherein the sensor circuit includes:
an amplifier circuit having a first amplifier input terminal and a second amplifier input terminal;
a first resistor coupled between the first amplifier input terminal and the input terminal; and
a second resistor coupled between the second amplifier input terminal and the output terminal;
wherein the amplifier circuit regulates a voltage at the first amplifier input terminal and a voltage at the amplifier second input terminal to be a same level by a negative feedback control mechanism;
wherein the amplifier circuit generates an amplification current, and wherein the sensing signal is proportional to the amplification current.

21. The control circuit of claim 20, wherein the sensor circuit further includes:
a current mirror circuit, which is configured to operably duplicate and amplify the amplification current, so as to generate the sensing signal.

22. The control circuit of claim 20, wherein the amplifier circuit includes: a first super source follower.

23. The control circuit of claim 14, wherein the gate-source voltage adjustment circuit includes:
a first impedance circuit coupled between a first gate of the first switch and a first source of the first switch, wherein the first impedance circuit is configured to operably adaptively adjust the first gate-source voltage according to the sensing signal.

24. The control circuit of claim 23, wherein the gate-source voltage adjustment circuit further includes:
a super source follower coupled between the sensor circuit and the first impedance circuit, wherein the super source follower is configured to operably generate two summation currents according to a sensing current correlated with the sensing signal and a constant current; and
a second impedance circuit coupled to the super source follower;
wherein the two summation currents flow through the first impedance circuit and the second impedance circuit, respectively, so as to adaptively adjust the first gate-source voltage.

25. The control circuit of claim 14, wherein the first switch includes a first metal oxide semiconductor (MOS)

device, and wherein the voltage difference is correlated with a drain-source voltage of the first MOS device, and wherein the conduction resistance is correlated with a channel resistance of the first MOS device when the first MOS device is in ON operation; wherein the sensing signal is proportional to a drain-source current of the first MOS device when the first MOS device is in ON operation; wherein the gate-source voltage adjustment circuit is configured to operably adaptively adjust the first gate-source voltage according to the voltage difference, so as to maintain the channel resistance of the first MOS device at the constant when the first MOS device is in ON operation.

26. The control circuit of claim 16, wherein the first switch includes a first metal oxide semiconductor (MOS) device, whereas the second switch includes a second MOS device, and wherein the voltage difference is correlated with a sum of a drain-source voltage of the first MOS device plus a drain-source voltage of the second MOS device; wherein the conduction resistance is correlated with a sum of a channel resistance of the first MOS device when the first MOS device is in ON operation plus a channel resistance of the second MOS device when the second MOS device is in ON operation; wherein the sensing signal is proportional to a drain-source current of the first MOS device when the first MOS device is in ON operation; wherein the gate-source voltage adjustment circuit is configured to operably adaptively adjust the first gate-source voltage according to the voltage difference, so as to maintain the sum of the channel resistance of the first MOS device plus the channel resistance of the second MOS device at the constant.

27. A control method of an analog switch circuit, comprising the following steps:
   operating a first switch in the analog switch circuit according to a first gate-source voltage of the first switch, so as to convert an input signal of the input terminal to an output signal of the output terminal;
   generating a sensing signal according to a voltage difference between the input signal and the output signal; and
   adaptively adjusting the first gate-source voltage according to the sensing signal, so as to maintain a conduction resistance of the analog switch circuit at a constant while the voltage difference changes;
   providing a bulk source divided voltage into the voltage difference, so as to adaptively adjust the first gate-source voltage further according to the bulk-source divided voltage, so as to maintain the conduction resistance at the constant while the voltage difference changes;
   wherein the first switch is coupled in a current path formed between the input terminal and the output terminal.

28. The control method of claim 27, further comprising the following step:
   adaptively adjusting a second gate-source voltage of a second switch according to the sensing signal, so as to control the second switch, to thereby maintain the conduction resistance at the constant while the voltage difference changes;
   wherein the first switch and the second switch are coupled in series between the input terminal and the output terminal.

29. The control method of claim 27, wherein the step of generating the sensing signal according to the voltage difference between the input signal and the output signal includes the following steps:
   providing a first resistor, which is coupled between a first node and the input terminal; and
   providing a second resistor, which is coupled between a second node and the output terminal;
   regulating a voltage at the first node and a voltage at the second node to be a same level by a negative feedback control mechanism;
   generating an amplification current, wherein the sensing signal is proportional to the amplification current.

30. The control method of claim 27, wherein the first switch includes a first metal oxide semiconductor (MOS) device, and wherein the voltage difference is correlated with a drain-source voltage of the first MOS device, and wherein the conduction resistance is correlated with a channel resistance of the first MOS device when the first MOS device is in ON operation; wherein the sensing signal is proportional to a drain-source current of the first MOS device when the first MOS device is in ON operation; wherein the gate-source voltage adjustment circuit is configured to operably adaptively adjust the first gate-source voltage according to the voltage difference, so as to maintain the channel resistance of the first MOS device at the constant when the first MOS device is in ON operation.

31. The control method of claim 27, wherein the first switch includes a first metal oxide semiconductor (MOS) device, whereas the second switch includes a second MOS device, and wherein the voltage difference is correlated with a sum of a drain-source voltage of the first MOS device plus a drain-source voltage of the second MOS device; wherein the conduction resistance is correlated with a sum of a channel resistance of the first MOS device when the first MOS device is in ON operation plus a channel resistance of the second MOS device when the second MOS device is in ON operation; wherein the sensing signal is proportional to a drain-source current of the first MOS device when the first MOS device is in ON operation; wherein the step of adaptively adjusting the first gate-source voltage according to the voltage difference maintains the sum of the channel resistance of the first MOS device plus the channel resistance of the second MOS device at the constant.

* * * * *